United States Patent
Suwa et al.

[11] Patent Number: 6,155,131
[45] Date of Patent: Dec. 5, 2000

[54] HANDLING ROBOT

[75] Inventors: Tatsunori Suwa; Kazuhiro Hatake, both of Hiratsuka, Japan

[73] Assignee: Komatsu Ltd., Tokyo, Japan

[21] Appl. No.: 09/459,454

[22] Filed: Dec. 13, 1999

Related U.S. Application Data

[62] Division of application No. 09/077,827, Jun. 4, 1998, Pat. No. 6,062,099.

[30] Foreign Application Priority Data

| Feb. 2, 1996 | [JP] | Japan | P08-39136 |
| Mar. 15, 1996 | [JP] | Japan | P08-86062 |
| Mar. 29, 1996 | [JP] | Japan | P08-76038 |

[51] Int. Cl.$^7$ .................................................. G05G 11/00
[52] U.S. Cl. ............................. 74/490.05; 74/490.01; 901/23
[58] Field of Search ................... 74/490.01, 479.01, 74/490.03, 490.05; 901/15, 23, 28; 414/744.1, 744.2, 744.4

[56] References Cited

U.S. PATENT DOCUMENTS

| 5,765,983 | 6/1998 | Caveney et al. | 74/490.01 X |
| 5,771,748 | 6/1998 | Genov et al. | 74/390.03 |
| 5,879,127 | 3/1999 | Grunes et al. | 74/490.03 |
| 5,894,760 | 4/1999 | Caveney | 74/490.04 |
| 5,950,495 | 9/1999 | Ogawa et al. | 74/490.01 |

FOREIGN PATENT DOCUMENTS

| 57-173487 | 10/1982 | Japan. |
| 62-277228 | 12/1987 | Japan. |
| 1-74081 | 5/1989 | Japan. |
| 1-120336 | 8/1989 | Japan. |
| 2-83182 | 3/1990 | Japan. |
| 3-136779 | 6/1991 | Japan. |
| 4-271287 | 9/1992 | Japan. |

OTHER PUBLICATIONS

WO97/27977, entire document, Aug. 7, 1997.

*Primary Examiner*—David Fenstermacher
*Attorney, Agent, or Firm*—Wenderoth, Lind & Ponack, L.L.P.

[57] ABSTRACT

A handling robot includes at least four bosses (20a, 20b, 20c, 20d) disposed in a transfer chamber so as to be coaxial with one another and rotatable independently of one another. The bosses are deviated (staggered) in their positions along the axis of a center of rotation. Each of the bosses is provided with an arm (21a, 21b, 21c, 21d), respectively. A link (22a, 22b, 22c, 22d) is coupled to each of the arms, respectively. Two of the bosses which are adjacent to each other in an axial direction constitute a pair. A transfer table (8a, 8b) is coupled via a transfer table attitude regulating mechanism (B) to the respective leading ends of each pair of links. The links are, in turn, coupled to an arm of the pair of bosses to provide a plurality of transfer tables which are arranged so as to be deviated in their positions towards the axis of the center of rotation. An independent drive source (27a, 27b, 27c, 27d) is coupled to each of the bosses, respectively.

5 Claims, 30 Drawing Sheets

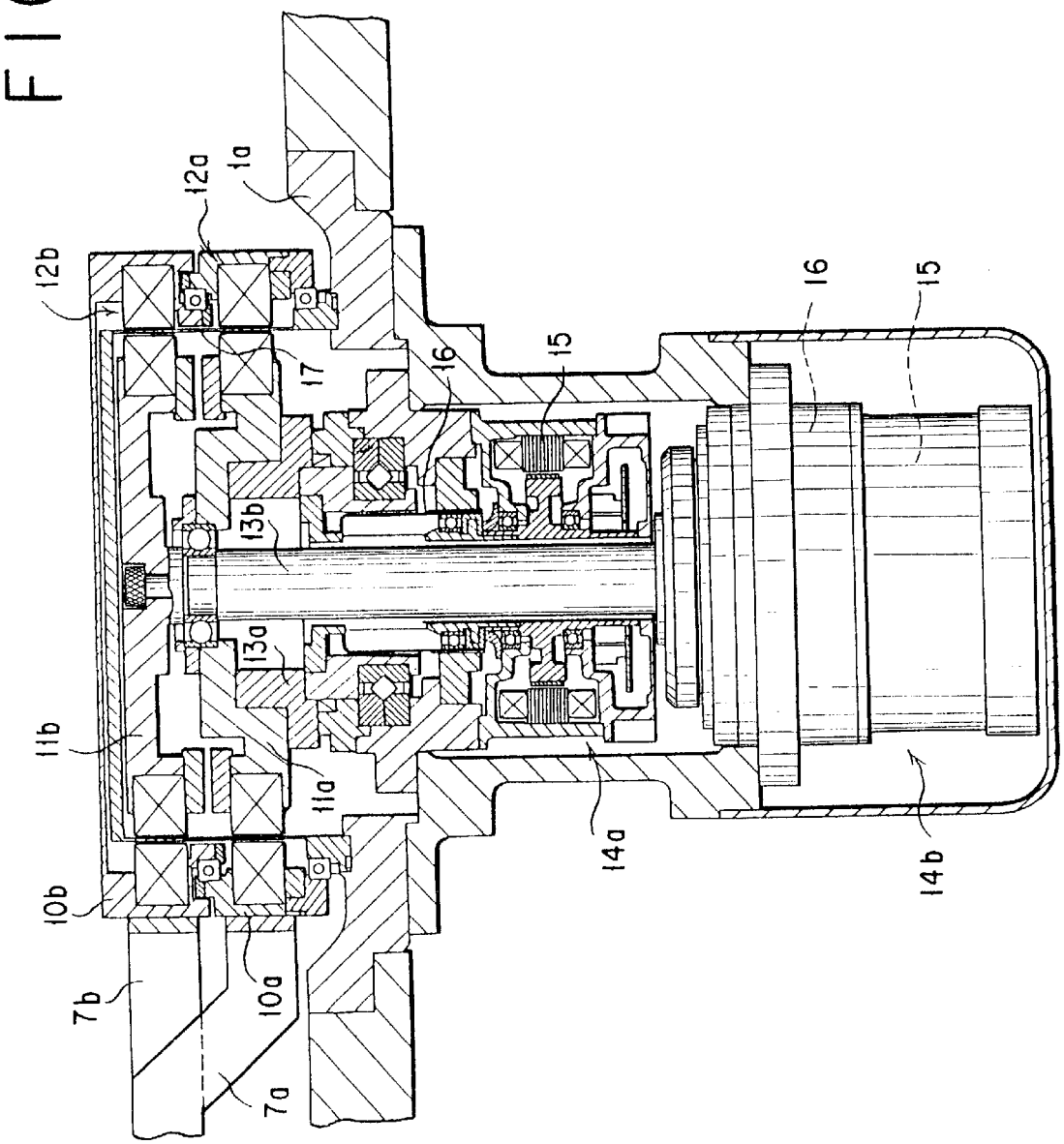

FIG. 8
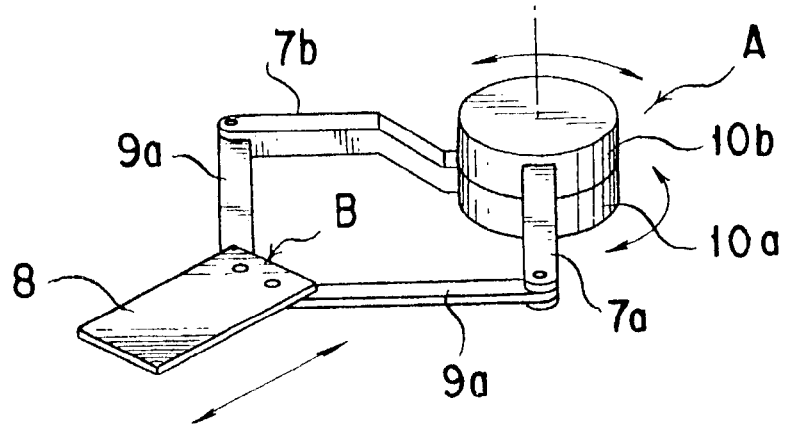
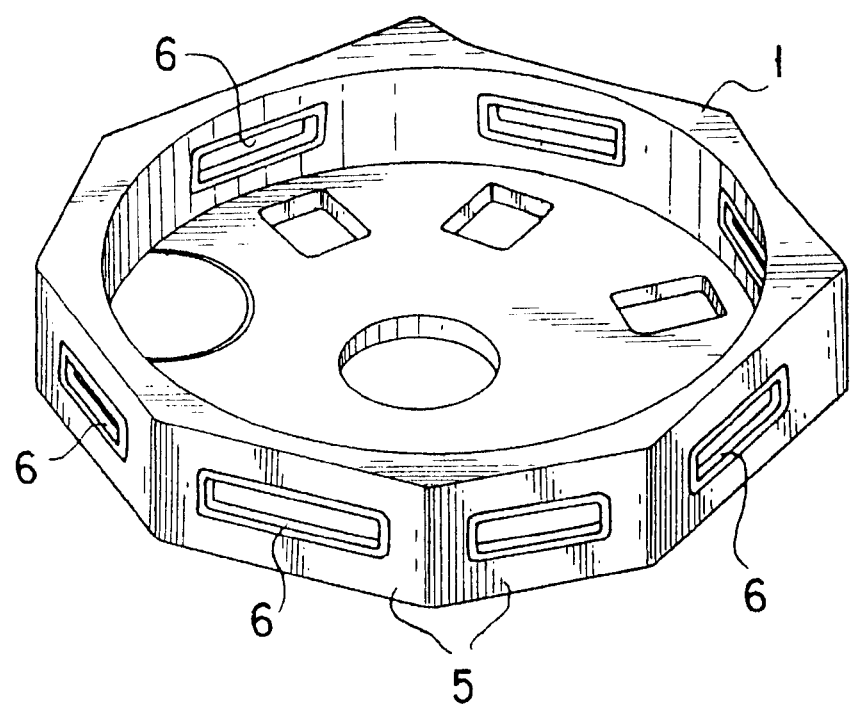

6,155,131

HANDLING ROBOT

This is a divisional application of application Ser. No. 09/077,827, filed Jun. 4, 1998 U.S. Pat. No. 6,062,099.

TECHNICAL FIELD

The present invention relates to a handling robot in a chamber type manufacturing system such as a semiconductor manufacturing system and an LCD manufacturing system, in which a plurality of process chambers are disposed around a single transfer chamber to constitute a like plurality of stations. A workpiece in the form of a thin plate such as a wafer that is to be machined and processed in each of the process chambers is, in a clean state or an evacuated (low pressure) state, conveyed by the handling robot that is arranged in the transfer chamber, via the transfer chamber from one of the process chambers to another.

BACKGROUND ART

A multiple chamber type semiconductor manufacturing system is constructed as shown in FIG. 1 of the drawings attached hereto. The system has a plurality of process chamber stations 2a, 2b, 2c, 2d and 2e disposed around a transfer chamber 1, and also has arranged therein a pair of workpiece delivery stations 3 by each of which the workpiece is delivered to an outside thereof. The space within the transfer chamber 1 is kept in an evacuated state by a suction unit.

The above mentioned transfer chamber 1 is constructed as shown in FIG. 2 of the drawings attached hereto and has a handling robot A provided at a central region thereof so as to be rotatable. It also is provided with a plurality of partition walls 5 that serve as the peripheral walls thereof. Each wall opposes one of the stations 2a, 2b, 2c, 2d and 2e or the workpiece delivery stations 3. There are also provided a plurality of gates 6 each of which constitutes both an inlet and an outlet for the workpiece to be fed into and out of each of the stations. Each such gate 6 is configured so as to be opened and closed by an opening and closing door (not shown) that is disposed in opposition to each of the gates 6.

As the above mentioned handling robot A, there has hitherto been used an apparatus of a so called frog leg type with a pair of arms, and its construction is as shown in FIGS. 3 to 7 of the drawings attached hereto.

In this construction, the pair of arms, designated as 7a and 7b, have an identical length and are arranged so as to be rotatable about a center of rotation. On the other hand, there are provided a pair of transfer tables 8a and 8b that have respective bases. Each of the transfer tables is connected to a first end of one of two legs of one of two pairs of links 9a and 9b which have an identical length. The first end of each of the two legs of each pair of links 9a and 9b is coupled via a frog leg type transfer table attitude regulating mechanism to one of the transfer tables 8a and 8b, respectively. Therefore, the links 9a and 9b may be rotated in a pair of directions, each of which is completely symmetrical with respect to the said transfer tables 8a and 8b.

Each of the pair of links 9a and 9b which are coupled to the transfer table 8a or 8b are also coupled to one of the said pair of arms 7a and 7b, whereas each of the other pair of links 9a and 9b is coupled to the other one of the arms 7a and 7b, respectively.

FIG. 4A in the drawings attached hereto shows the transfer table attitude regulating mechanism B of the above mentioned frog leg type, in which the respective forward end portions of the links 9a and 9b in the pair which are coupled to the transfer tables 8a and 8b are coupled together in a gear configuration. The gear configuration comprises a pair of gears 9c and 9c which mesh with each other so that the angles of attitude θR and θL of the links 9a and 9b with respect to the said transfer tables 8a and 8b may always be identical to each other. This allows each of the transfer tables 8a and 8b to always be oriented in a radial direction and operated in the radial direction.

It should be noted, however, that the above mentioned links 9a and 9b may not necessarily be coupled together in a gear arrangement, but may alternatively be coupled together with a crossed belting arrangement 9d as shown in FIG. 4B of the drawings attached hereto.

FIG. 5 of the drawings attached hereto shows a mechanism for permitting the above mentioned arms 7a and 7b to be rotated independently of each other.

The respective bases of the arms 7a and 7b are each configured in the form of a ring shaped boss, and such ring shaped bosses 10a and 10b are configured so as to be coaxial about the center of rotation and to be rotatably supported with respect to a frame 1a of the transfer chamber 1.

On the other hand, the said ring shaped bosses 10a and 10b have a pair of disk shaped bosses 11a and 11b disposed therein, respectively, wherein a ring shaped boss and a disk shaped boss oppose each other and are arranged so as to be coaxial with each other. A first pair of mutually opposing ring shaped and disk shaped bosses and a second pair of the mutually opposing ring shaped and disk shaped bosses are coupled and decoupled with each other via each of magnetic couplings 12a and 12b, respectively, in each of the directions of rotation.

The above mentioned pair of disk shaped bosses 11a and 11b have their respective rotary shafts 13a and 13b arranged so as to be coaxial with each other. The said rotary shafts 13a and 13b are coupled to the output sections of a pair of motor units 14a and 14b, respectively. The motor units are coaxial with the frame 1a of the transfer chamber 1, and are supported with their positions deviated in their axial direction.

The above mentioned motor units 14a and 14b have each integrally coupled thereto a motor 15 (which comprises, for example, an AC servo motor) and a speed reduction gear 16 (which comprises, for example, a Harmonic Drive which is a trade name, identically referred to hereinafter). Such reduction gears 16 and 16 have their output sections which are coupled to the respective bases of the rotary shafts 13a and 13b, respectively.

Since the space within the transfer chamber 1 in which the arms 7a and 7b are positioned is held in an evacuated state, there is provided a sealing partition 17 between the ring shaped boss 10a and the disk shaped boss 11a, and between the ring shaped boss 10b and the disk shaped boss 11b of the present arm rotary mechanism.

FIGS. 7A and 7B show an operation of the above mentioned handling robot A. As shown in FIG. 7A, when the two arms 7a and 7b are located at diametrically symmetrical positions with respect to the center of rotation, the links 9a and 9b will be in a state in which they assume their most retracted positions with respect to each of the transfer tables 8a and 8b. Therefore, the transfer tables may both be displaced toward the center of rotation.

In this state, by rotating the two arms 7a and 7b in an identical direction, it can be seen that the two transfer tables 8a and 8b will be rotated about the said center of rotation whilst maintaining the radial positions thereof.

By rotating the two arms 7a and 7b in the directions in which they may approach each other (or in the mutually opposite directions), from the state shown in FIG. 7A, it can be seen that one of the transfer tables 8a (that is located at such a position that the angle made by the two arms 7a and 7b is reduced) will be pushed by the links 9a and 9b so as to be projected in a radially outward direction. Therefore, it may be thrust into one of the above mentioned stations 2a, 2b, 2c, 2d, 2e and 3 which are disposed adjacent to the radially outward side with respect to the transfer chamber 1 as shown in FIG. 7B.

At this point of time, while the other of the transfer tables will be displaced towards the center of rotation, it can be seen that its amount of displacement will be small because of the angle that is made between the arms 7a and 7b and the angle that is made between the links 9a and 9b.

The above mentioned conventional handling robot has been expected to provide a functional effect as a two arm robot by virtue of the advantage that a pair of transfer tables are provided and can alternately or consecutively be used for each of a variety of stations. It has been found, however, that as a matter of reality there arises the following problem.

More specifically, since each of the pair of transfer tables is coupled via a pair of links commonly to a pair of arms, respectively, it has been found that when one transfer table is displaced towards a station, the other transfer table must necessarily be in a stand-by state. This will make it impossible for an individual transfer table to be displaced optionally towards a station.

Also, in a case where a transfer table is to be rotated, a pair of transfer tables must be rotated together, and this makes it impossible for an individual transfer table to be rotated as desired.

From the reasons mentioned above, in spite of the fact that there have specially been provided a pair of transfer tables, it is found that such a provision by itself has not contributed to a desired shortening of the time cycle in a semiconductor manufacturing system that has been provided with a plurality of process chambers around a transfer chamber.

Also, in the above mentioned conventional handling robot, it is noted that a drive mechanism for rotating each of the arms comprises a pair of the motor units 14a and 14b, each of which combines the motor 14 with a speed reduction gear 16 that is high in speed reduction ratio. Since such speed reduction gears 16 and 16 of the motor units 14a and 14b have their output sections which are connected via a pair of the rotary shafts to a pair of the disk shaped bosses 11a and 11b, it has been found that there must be an elongated path of power transmission provided from each of the respective output sections of the said speed reduction gears to a corresponding one of the said disk shaped bosses.

It may also be noted that as shown in FIG. 6 of the drawing attached hereto, there has been another construction of the handling robot in which a pair of disk shaped bosses 11a' and 11b' are provided on the interior with a pair of inner teeth gears 11c and 11d, respectively. A pair of pinion gears 13c and 13d mesh, respectively, with the pair of inner teeth gears.

The pinion gears 13c and 13d are securely fixed to a pair of rotary shafts 13a' and 13b', which in turn are coupled to the speed reduction gears of the motor units 14a and 14b, respectively. Such a construction, however, again requires that there should be provided an elongated path of power transmission from each of the respective output sections of the speed reduction gears to a corresponding one of the disk shaped bosses.

In the drive mechanism of the conventional handling robot, the need for an elongated path of power transmission from a motor unit to a disk shaped boss as noted above has resulted in an insufficiently low torsional rigidity. Also, since a transmission torque is increased at a speed reduction gear that is remote from a disk shaped boss via a rotary shaft, a deformation thereof may give rise to an error in rotation thereof which produces an error in the rotary angle of an arm. Thus, a bottle neck in accurately controlling the rotary angle of the handling robot in the prior art is produced.

It may also be noted that a handling robot to be used in a clean room or an evacuated state in an above mentioned semiconductor manufacturing system requires that very little dust should be introduced therein so that no foreign matter may adhere to an object being conveyed.

In a conventional handling robot as generally mentioned above and particularly as shown in FIG. 8 of the drawings attached hereto, a transfer table 8 that enters into and comes out of each of the stations 2a–2e via a said gate 6 is coupled to a pair of the arms 7a and 7b via the transfer table attitude regulating mechanism B of a frog leg type having a pair of rotary nodes. However, it has been found that there arises the problem that a portion of a gear transmission mechanism or a belt transmission mechanism which is included in the transfer table attitude regulating mechanism B may be a source of dust from which dust can develop. A further problem has been that such a portion also tends to be loosened, giving rise to a positioning inaccuracy.

Accordingly, the present invention has been made with the foregoing problems taken into account. Its generic object is to provide a handling robot whereby the cycle time for a manufacturing operation can be shortened by permitting an action for conveying each of a plurality of transfer tables into and out of each of the stations, and whereby this action can be carried out independently of the other transfer tables. The accuracy at which an arm is rotated in a controlled manner can be enhanced by not permitting any error within the path of power transmission to influence the control of the rotary angle of the arm.

A further important object of the present invention is to provide a handling robot whereby dust that may be produced at a coupling portion between a transfer table and an arm can be reduced to a very minimum, and any loosening that may develop at the coupling portion can also be reduced to a very minimum.

SUMMARY OF THE INVENTION

In order to achieve the object mentioned above, there is provided in accordance with the present invention, a handling robot which is so configured that at least four bosses may be disposed in a transfer chamber. The bosses are coaxial to one another and rotatable independently of one another, and can be deviated in their positions towards the axis of a center of rotation. Each of the bosses may be provided with an arm, respectively, and a link may be coupled to each of such arms, respectively. Two of the bosses which are adjacent to each other in an axial direction may constitute a pair. A transfer table may be coupled via a transfer table attitude regulating mechanism to the respective leading ends of each pair of such links, and each of the links are in turn coupled to an arm of each of the pair of bosses to provide a plurality of such transfer tables which are arranged so as to be deviated in their positions towards the axis of the center of rotation. An independent drive source may be coupled to each of the said bosses, respectively.

By rotating the pair of bosses oppositely to each other to cause a pair of arms coupled thereto to rotate in their respective directions in which they approach each other, a transfer table will be allowed to project in its radial direction via the links coupled to the pair of arms. Also, by causing the pair of arms to be rotated in their respective directions in which they depart from each other, the transfer table will be moved so as to be sunk or retracted.

Also, by permitting the pair of bosses to rotate in an identical direction, a transfer table will be rotationally driven while maintaining its radial position.

The arms and links which individually constitute the pairs have their respective lengths which are identical to each other, with two arms and two links being identical with respect to a single such transfer table. It should be noted, however, that arms and links of different transfer tables need not be of an identical length in each individual pair. In this case, it can be seen that their transfer displacement should be variant for different transfer tables.

As mentioned above, it can be noted that according to a handling robot provided in accordance with the present invention, each individual transfer table may, regardless and independently of other transfer tables, perform a workpiece transfer operation between a transfer chamber and each of a variety of stations. Each individual transfer table may also perform a workpiece transfer operation in a rotary direction within the transfer chamber.

Accordingly, it can be appreciated that a handling robot according to the present invention, as it is installed in a semiconductor manufacturing system, may fully perform a variety of functional effects as a multiple arm (double arm) robot that can serve as a means for transferring a workpiece in a multiple chamber type manufacturing system, and will drastically shorten the cycle time of a workpiece transfer operation.

Also, in the construction mentioned above, a handling robot according to the present invention can be constructed so that a first boss section that comprises a first pair of bosses arranged in the axial direction and a first pair of drive units respectively coupled to the bosses may be separately configured from a second boss section that comprises a second pair of bosses arranged in the axial direction and a second pair of drive units coupled respectively to the bosses. The first and second boss sections may be arranged so as to oppose each other and in such a manner that the bosses may be made coaxial with one another. The plurality of transfer tables may be arranged between the first and second boss sections so as to be deviated in their positions towards the axis of the center of rotation.

The first boss section that comprises the first pair of bosses arranged in the axial direction and the first pair of drive units respectively coupled to the bosses is separately configured from the second boss section that comprises the second pair of bosses arranged in the axial direction and the said second pair of drive units respectively coupled to the bosses. Thus, it will be seen that a transfer table can be arranged between these boss sections.

According to the above mentioned construction, it can be seen that the boss sections for driving each of a pair of transfer tables, respectively, can be made individual. In addition, by positioning these boss sections so they are spaced apart from each other, a transfer table may be disposed between them. Thus, such a transfer table may be made larger in its sinking (retracted) direction.

In the above mentioned construction, it is possible that inside of the bosses which are ring shaped, there may be different bosses which are disk shaped and are supported by a frame of the transfer chamber so that the disk shaped bosses and each of the said ring shaped bosses may be coupled together via a magnetic coupling. Therefore, they can be coupled and uncoupled with each other in a rotary direction. Each of the disk shaped bosses may be provided inside thereof with a speed reduction gear. The reduction gear that is provided inside of each such disk shaped boss may have an input member thereof to which is coupled a rotary shaft, respectively, the rotary shafts may be arranged so as to be coaxial with one another about the center of rotation and so as to extend towards one side of the axis of the center of rotation, and each of the said rotary shafts may be coupled to a motor, respectively.

According to the construction mentioned above, it can be seen that a rotation of the drive source which causes a rotation of each of the disk shaped bosses will be transmitted via the rotary shaft to the speed reduction gear whose output will be directly transmitted to a disk shaped boss. It can also be seen that a ring shaped boss will, by permitting the disk shaped boss that is disposed inside of the ring shaped boss to be rotated by the drive source via the speed reduction gear, be rotated via the magnetic coupling.

According to the construction mentioned above, it can further be seen that an output member of the speed reduction gear can be directly coupled to a drive member for rotationally driving an arm. Thus, an error in the angle of rotation that occurs until the error arrives at a drive unit from a prime mover over a rotary shaft and a reduction gear will be transmitted as it is reduced by a reduction gear ratio of the speed reduction gear. As a result, any influence of an error in the angle of rotation prior to the arrival of the error at the speed reduction gear can be drastically reduced. This may allow a power of rotation to be transmitted without transmitting such an error in the angle of rotation from the speed reduction gear up to a disk shaped boss. Hence, an enhancement in the accuracy in the control of a rotary angle of an arm will be ensured.

In the above mentioned construction, it is possible that such motors may be disposed in parallel to one another around the center of rotation of the disk shaped bosses. Each of the motors and each of the rotary shafts may be coupled together by a power transmission means such as a timing belt.

Alternatively, it is also possible that such motors may be disposed in series with one another in the direction of the axis of the center of rotation of the disk shaped bosses. Each of the motors may have an output member thereof that is directly coupled to each of the rotary shafts, respectively.

According to a construction as mentioned above, it will be seen that the above mentioned motors which constitute the respective prime mover sources for the plurality of arms can be selectively arranged in the frame (i.e., either in parallel to one another around the said center of rotation or in series with one another along the center of rotation) in accordance with a particular frame construction employed for the transfer chamber.

Furthermore, in the above mentioned construction, it is possible that at least one of the plurality of transfer tables may be capable of being displaced towards the axis of the center of rotation.

It is also possible that at least one pair of the bosses which are ring shaped and the said drive units for driving the at least one pair of ring shaped bosses may be capable of being displaced towards the axis of the center of rotation.

Also, it is possible that a pair of the ring shaped bosses which are coupled to at least one of the plurality of transfer tables and a pair of the disk shaped bosses which are positioned inside of the pair of ring shaped bosses may each be supported so as to be displaceable towards the axis of the center of rotation. Each of the ring shaped bosses and each of the disk shaped bosses which are opposing each other may be coupled together by a magnetic coupling. The coupling can be a linear rotary type which is made capable of transmitting both a force of rotation and a force of straight advancement in an axial direction. The inside positioned pair of disk shaped bosses may be coupled to a linear actuator for displacing the pair of disk shaped bosses.

It is also possible that at a section at which a transfer table and a link coupled to the transfer table are coupled together, there may be provided a displacement mechanism for displacing the transfer table towards the axis of the center of rotation with respect to the link.

It is also possible that at a section at which a link and an arm are coupled together, there may be provided a displacement mechanism for displacing the link towards the axis of the center of rotation with respect to the arm.

According to a construction as mentioned above, it can be seen that by allowing the position of a transfer table in the axial direction of the center of rotation to lie at the position of a gate, the transfer table will be selectively opposed to the gate when the transfer table is operatively projected into any one of the stations. Thus, the height of the gate of the transfer chamber can coincide with the height of a single one of the transfer tables. The sealing ability by way of an opening and closing door for the gate is thereby improved.

Especially, in the construction in which the above mentioned displacement mechanism is provided, it can be noted that since a displacement towards the axial direction is effected closer to the leading ends than a transfer table or a arm, its mass of displacement may be made smaller.

In the construction mentioned above, it is possible that a boss section including a drive unit may be supported so as to be displaceable towards the axis of the center of rotation with respect to the frame. In addition, a linear actuator may be coupled to the boss section.

According to the construction mentioned above, it can be seen that by permitting the entire handling robot to be moved up and down with respect to the frame, the structure of such a driving section can be vastly simplified.

In the construction mentioned above, it is possible that at least one of the first boss section and the second boss section may be supported so as to be displaceable towards the axis of the center of rotation with respect to the frame. A linear actuator may be coupled to the at least one boss section.

According to the above mentioned construction, it will be seen that since the handling robot can be divided into two separate portions, it may be sufficient for an individual displacement unit to be reduced in size.

In the construction mentioned above, it is possible that both a ring shaped boss and a disk shaped boss which oppose each other via a magnetic coupling may be capable of being displaced towards the axis of the center of rotation. A pair of boss sections of the disk shaped bosses which are adjacent to each other in the axial direction may be coupled together by a speed reduction gear. A cam ring may be provided coaxially with each of the disk shaped bosses of the boss sections. A cam engagement member that is provided for each of the disk shaped bosses may be engaged with a cam portion that is provided in the cam coupling. The cam may be configured so that when the pair of disk shaped bosses are rotated oppositely to each other, they can be displaced as a whole along the axial direction.

According to the construction mentioned above, it can be seen that because an actuator does not need to be provided for effecting a displacement in the axial direction, and because the number of control axes may be small, a control program can be drastically simplified.

Furthermore, in the construction mentioned above, it is possible that at a section at which a link and an arm are coupled together, there may be provided a cam shaft having a cam portion and a cam engagement member fitted with the cam portion so that they can be coupled to one of the link and the arm. The cam portion may be configured so that when each pair of arms are rotated in their respective directions which are opposite to each other, the pair of links can be displaced in an axially identical direction.

According to the above mentioned construction, it can be seen that by permitting an axial displacement of a link with respect to an arm to be achieved so that they may be relatively rotated, an actuator for the purpose of such a displacement will become needless and a control program can be vastly simplified.

In order to attain another object noted previously, there is provided in accordance with the present invention, a handling robot in which there are provided at least two bosses so as to be coaxial with each other. The bosses may be independently of each other and may be deviated in their positions along the axis of a center of rotation. Each of the bosses is provided with an arm that is coupled to one of the links. A transfer table is coupled to the leading ends of a pair of the links, and an independent drive source is coupled to each of the bosses. The handling robot is configured such that one of the pair of links and the transfer table are integrally structured. The other one of the pair of links is coupled to the transfer table via a rotary node.

According to the construction mentioned above, it can be seen that by permitting the pair of bosses to be rotated oppositely to each other to allow them to be rotated in their respective directions in which they approach each other, a transfer table will be allowed to project into a desired one of the stations by the transfer chamber via those links which are coupled to the pair of the arms. Also, by permitting the pair of arms to be rotated in their respective directions so that they depart from each other, the transfer table will be moved so as to be sunk (or retracted).

Then, it can be seen that since the transfer table is structured integrally with one of the links, its attitude when projected or sunk may not be constant, and it will be displaced while drawing a trajectory in which its attitude may follow the attitude of the above mentioned one link. Accordingly, the pair of arms can be controlled with respect to their angles of rotation so that the transfer table may be projected and retracted while permitting it to follow a predetermined trajectory passing through a gate.

According to the construction mentioned above, it can be seen that by allowing a coupling between a transfer table and a link assembly to be effected at a rotary node, dust may be produced much less frequently at a section at which the transfer table and the link assembly are coupled together. It should also be noted that since the number of such rotary nodes is reduced by one, a loosening that may occur at a rotary node can be minimized.

BRIEF EXPLANATION OF THE DRAWINGS

The present invention will be better understood from the following detailed description and the drawings attached hereto showing certain illustrative embodiments of the present invention. In this connection, it should be noted that such embodiments as illustrated in the accompanying drawings are intended in no way to limit the present invention, but rather to facilitate an explanation and understanding thereof In the accompanying drawings:

FIG. 5 is a cross sectional view illustrating an arm rotary mechanism for the conventional handling robot;

FIG. 8 is a decomposed perspective view illustrating a relationship between a transfer chamber and another conventional handling robot;

BEST MODES FOR CARRYING OUT THE INVENTION

Figure 1:
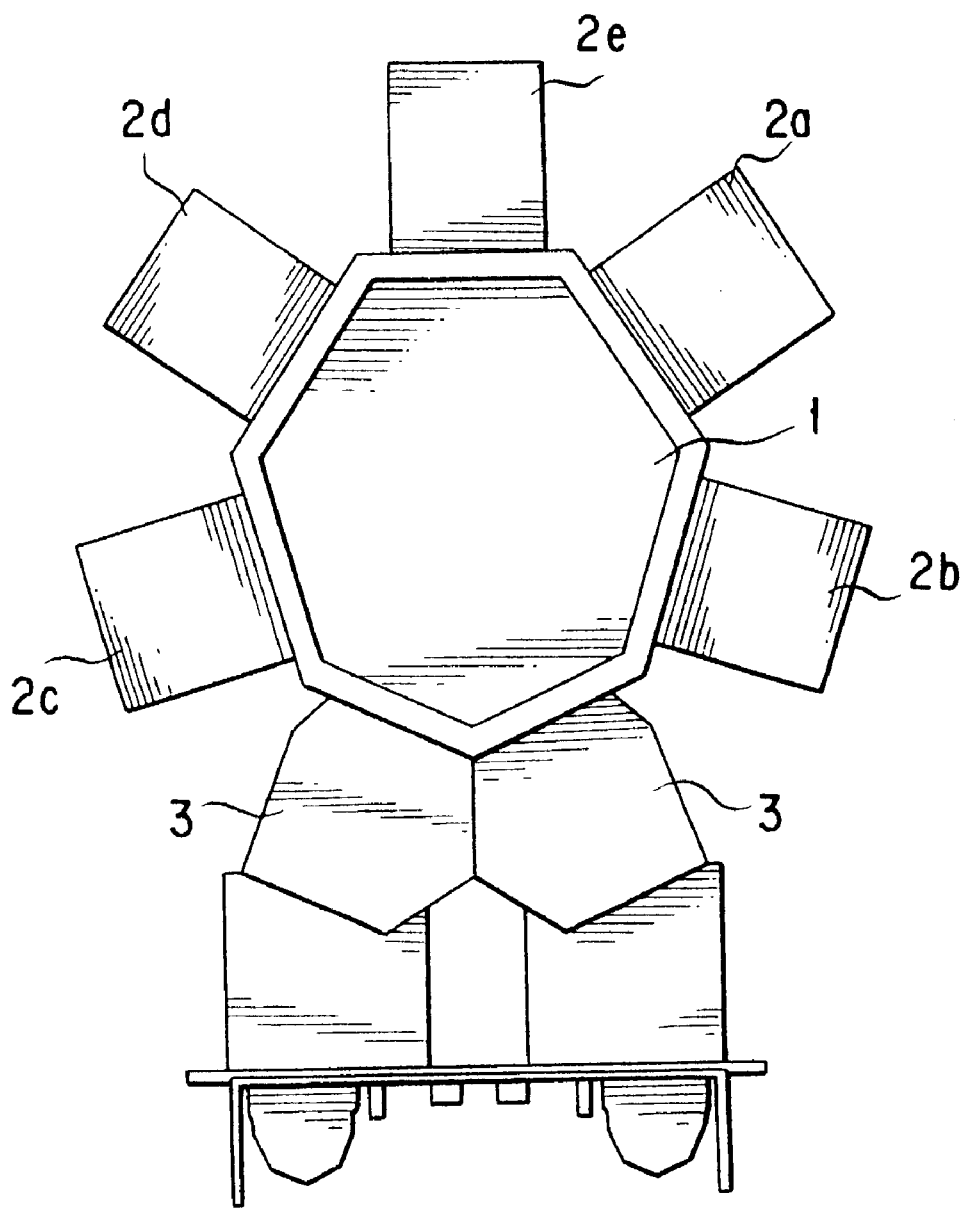
FIG. 1 is a top plan view diagrammatically showing a semiconductor manufacturing system that constitutes an example of a multiple chamber type manufacturing system.
Figure 2:
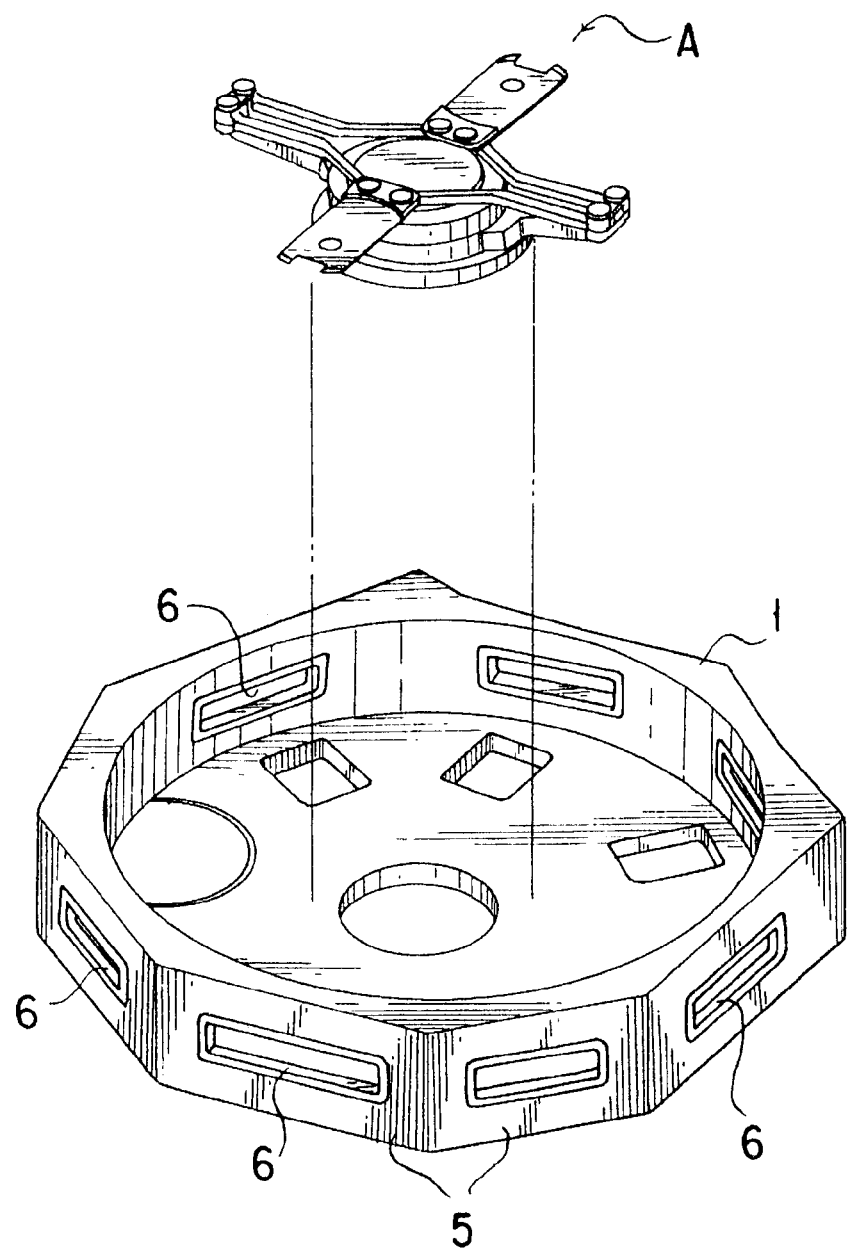
FIG. 2 is a decomposed perspective view illustrating the relationship between a transfer chamber and a conventional handling robot.
Figure 3:
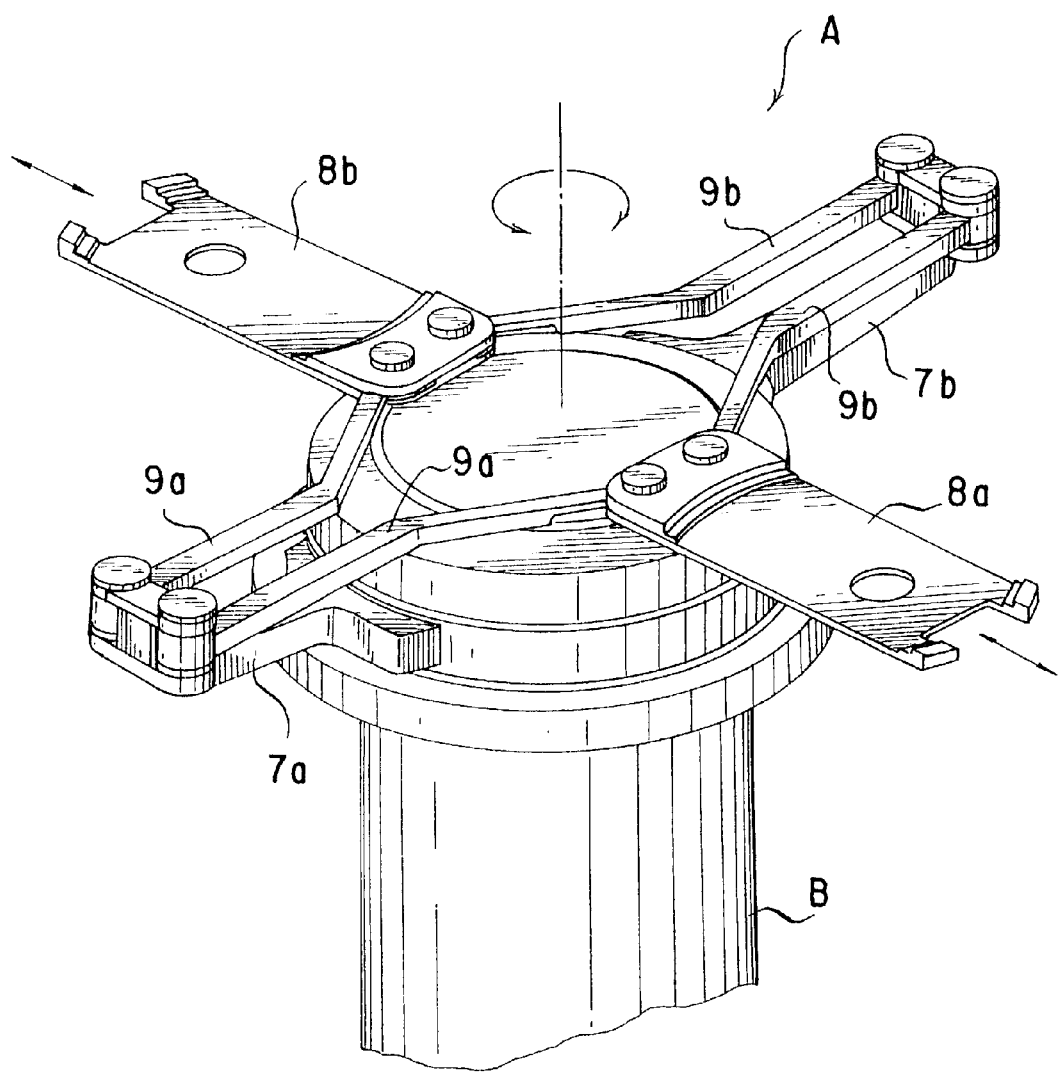
FIG. 3 is a perspective view illustrating the conventional handling robot.

Hereinafter, suitable embodiments of the present invention with respect to a handling robot will be set forth with reference to the accompanying drawings hereof.

A detailed explanation will now be given of a certain embodiment of the present invention with reference to FIGS. 9 through 29. In the explanation of the present embodiment, it should be noted that the same reference numerals and characters (individually or in combination) which are used in the description of the prior art to designate the same components or parts in FIGS. 1 to 7, are used here. It should also be noted that the present embodiment is intended to make use of a pair of transfer tables.

A transfer chamber 1 has a central region in which four ring shaped bosses 20a, 20b, 20c and 20d are supported coaxially with one another. The bosses are each rotatable in a state in which they are stacked successively from a lower side of the transfer chamber. Each of the ring shaped bosses is provided with a corresponding one of four arms 21a, 21b, 21c and 21d which have an identical length, respectively.

The second arm 21b and the third arm 21c located in a mid region are bent downwards and upwards, respectively. The leading end of the second arm 21b is located at the same level as that of the first arm 21a with respect to the axial direction of their center of rotation, whereas the leading end of the third arm 21 is located at the same level as that of the fourth arm 21d with respect to the axial direction of the center of rotation.

A pair of links 22a and 22b which are coupled to the respective leading ends of the first and second arms 21a and 21b, respectively, are coupled to a single transfer table 8a via a transfer table attitude regulating mechanism of a frog leg type. Also, a pair of links 22c and 22d which are coupled to the respective leading ends of the third and fourth arms 21c and 21d, respectively, are similarly coupled to a single transfer table 8b via such a transfer table attitude regulating mechanism.

Then, the first, second, third and fourth ring shaped bosses 20a, 20b, 20c and 20d can be rotated so as to cause the first and second arms 21a and 21b to be rotated in their respective directions in which they approach each other. Thus, it can be seen that as with the prior art, the transfer table 8a (which is coupled with the first and second arms 21a and 21b) will be projected radially outwards of the transfer chamber 1. Also, if the first and second arms 21a and 21b are caused to rotate in their respective direction in which they depart from each other, the above mentioned transfer table 8a will be moved so as to be sunk or retracted radially inwards of the transfer chamber 1.

On the other hand, if the pair of the arms 21a and 21b are rotated in an identical direction, the transfer table 8a will be rotated in that same direction of rotation while maintaining its radial position.

Such an operation of the third and fourth arms 21c and 21d should be performed in the entirely same manner as the above.

In such an operation, one pair of the first and second arms 21a and 21b and the other pair of the third and fourth arms 21c and 21d are each rotated in a state in which they are spaced apart from each other in their vertical direction (i.e., in the axial direction of the center of rotation) and hence do not interfere with each other. Thus, the two transfer tables 8a and 8b which are coupled with respective pairs of arms, will be operated independently of each other as desired with respect to the said projection, retraction and rotation.

In an inside in which the above mentioned ring shaped bosses 20a, 20b, 20c and 20d are opposing one another, four disk shaped bosses 23a, 23b, 23c and 23d are supported by a frame 1a of the transfer chamber 1 so as to be each rotatable in a state in which they are laid one above another in their axial direction.

Each of the ring shaped bosses 20a, 20b, 20c and 20d and each of the said disk shaped bosses 23a, 23b, 23c and 23d which oppose each other are coupled together by each of four magnetic couplings 24a, 24b, 24c and 24d, respectively, and also so uncoupled, in a rotary direction thereof.

In the above mentioned construction, it should be noted that in order to maintain the interior of the transfer chamber 1 in an evacuated state, a sealing partition wall 17 is provided between the ring shaped bosses and the disk shaped bosses. It should also be noted that in place of the above mentioned magnetic couplings 24a to 24d, there may be used a magnetic fluid seal (i.e., a ferro-seal that contains a permanent magnet).

Inside of the above mentioned disk shaped bosses 23a to 23d, four speed reduction gears 25a, 25b, 25c and 25d are incorporated, respectively. Each of the speed reduction gears, in view of the requirements that it should be incorporated within a disk shaped boss (a space that is extremely limited) and that it should produce an extremely high ratio of speed reduction, has made use of a Harmonic Drive. The Harmonic Drive is a flat type that consists of a wave generator a, a flex spline b and a pair of circular splines c and d, which has hitherto been used widely.

Four rotary shafts 26a, 26b, 26c and 26d are coupled to the respective input members of the speed reduction gears 25a to 25d, respectively. The rotary shafts are disposed coaxially with respect to one another, and the first, second and third rotary shafts 26a, 26b and 26c are hollow and fitted within one another. Thus, the second rotary shaft 26b is fitted in the first rotary shaft 26a, the third rotary shaft 26c is fitted in the second rotary shaft 26b and the fourth rotary shaft 26d is fitted in the third rotary shaft 26c.

Figure 12:
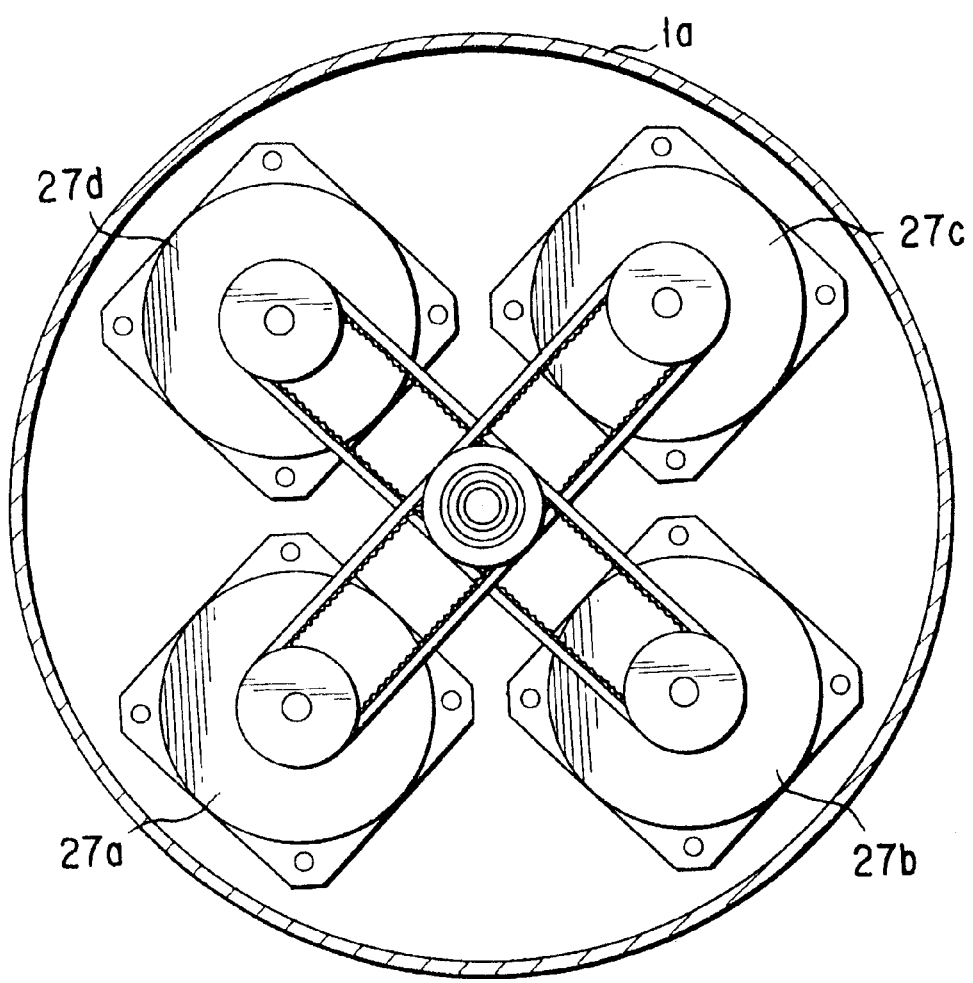
FIG. 12 is an explanatory view showing a state in which a plurality of motors are arranged in parallel to one another.

The respective lower ends of the rotary shafts 26a to 26d are successively deviated in their positions in their vertical direction and are each exposed into the said frame. A timing pulley is fastened to each such exposed portion. Also, the respective output shafts of four motors 27a, 27b, 27c and 27d are coupled to the said rotary shafts 27a, 27b, 27c and 27d via four timing belts, respectively. The motors 27a to 27d are disposed around the rotary shafts 26a to 26d so as to be deviated in their positions within the frame 1a as shown in FIG. 12.

Of the above mentioned four motors, the first and second motors 27a and 27b constitute one pair, whereas the third and fourth motors 27c and 27d constitute the other pair. The two pairs of motors are rotationally controlled, respectively.

More specifically, by permitting the first and second motors 27a and 27b to rotate in opposite directions over an identical angle of rotation, the respective rotations of the pair of motors 27a and 27b will be transmitted via a pair of timing belts to a pair of speed reduction gears 25a and 25b, a pair of disk shaped bosses 23a and 23b, a pair of magnetic couplings 24a and 24b, and a pair of ring shaped bosses 20a and 20b, respectively. Thus, the first and second arms 21a and 21b will be rotated oppositely so that they approach each other or so that they depart from each other. If they are rotated so that they approach each other, the transfer table 8a will be moved so as to be projected. If they are rotated so that they depart from each other, the transfer table 8a will be operatively moved so as to be sunk or retracted.

When the pair of motors 27a and 27b are rotated in an identical direction, the pair of arms 21a and 21b will be rotated as a whole in one direction or the other.

With the other pair of motors 27c and 27d, the entirely same operation will be performed as with the above mentioned first pair of motors 27a and 27b. Then, if the other pair of the third and fourth arms 21c and 21d are rotated symmetrically or in an identical direction by the other pair of the third and fourth motors 27c and 27d, the second transfer table 8b will be operatively moved so as to be projected or retracted.

Then, since the first pair of the first and second arms 21a and 21b and the other pair of the third and fourth arms 21c and 21d are spaced apart from each other in a vertical direction, the first pair of the first arms 21a and 21b and the other pair of the third and fourth arms 21c and 21d will be rotationally driven without interfering with each other.

The respective rotation of each of the above mentioned motors 27a to 27d will, as noted above, be introduced via a corresponding timing belt and a rotary shaft into the input member of a corresponding speed reduction gear. There, the rotation will be reduced in speed with a large reduction ratio and then furnished to a disk shaped boss corresponding thereto. Accordingly, if there is a loosening such as a back-lash due to a timing belt and if there is a deformation of a rotary shaft, an error in the angle of rotation will be transmitted after a reduction thereof by the reduction ratio to the output side. Hence, its influence on the output side will be vastly reduced.

Figure 13:
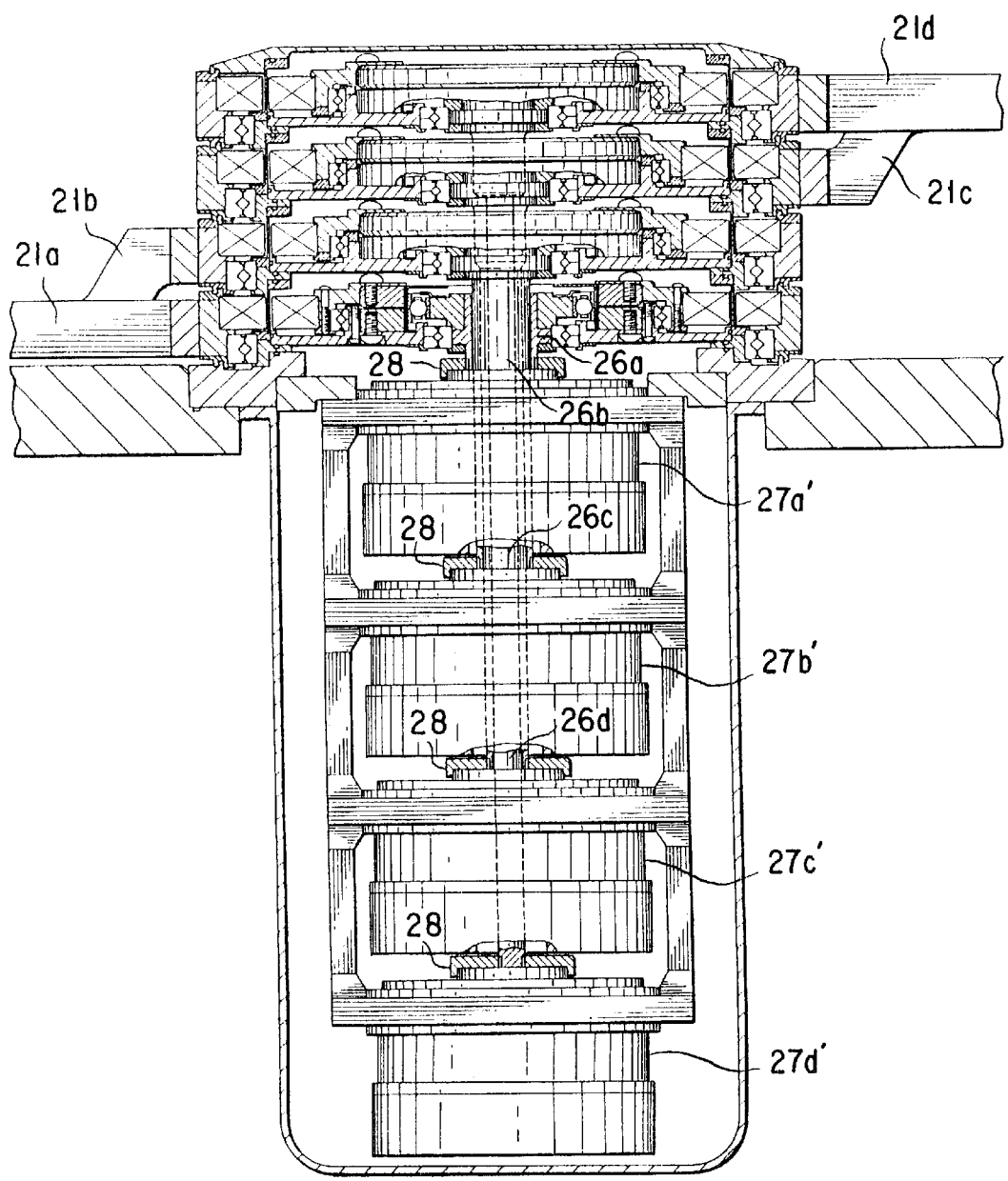
FIG. 13 is an explanatory view showing a state in which a plurality of motors are arranged in series with one another.

FIGS. 9 to 12 show an example in which the motors 27a to 27d (each of which is coupled to a rotary shaft corresponding thereto) are arranged around the center of rotation and a timing belt is used as a means for coupling them together. It should be noted, however, that the motors may alternatively be arranged in series with one another in the direction of the center of rotation as shown in FIG. 13.

In this case, the first to third motors 27a' to 27c' (all except the fourth motor 27d' that lies at the lowest point) are configured so as to be hollow or to provide three hollow spaces therein into which the second to fourth rotary shafts 26b and 26d are successively inserted.

In this example, the respective output members 28 of the motors 27a' to 27d' are directly coupled to the rotary shafts 26a to 26d, respectively.

In a handling robot according to the present invention, it has been shown that each single transfer table will be operatively moved so as to be projected and to be sunk or retracted radially with respect to the center of rotation by one or the other symmetrical rotations of a pair of motors. Each transfer table will also be rotationally operated by rotating the pair of motors in an identical direction.

Figure 10:
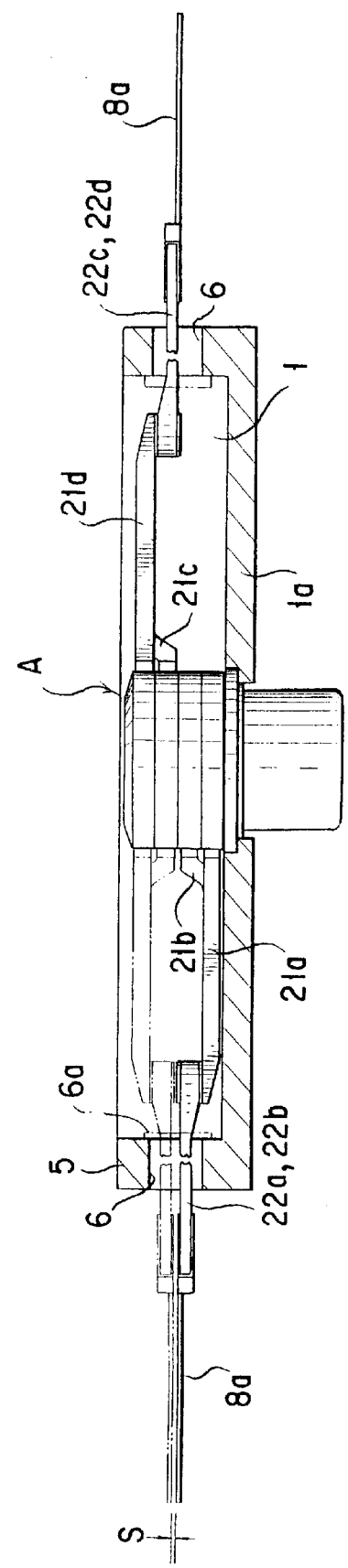
FIG. 10 is a front view, partly cut away, showing the handling robot according to the present invention.
Figure 11:
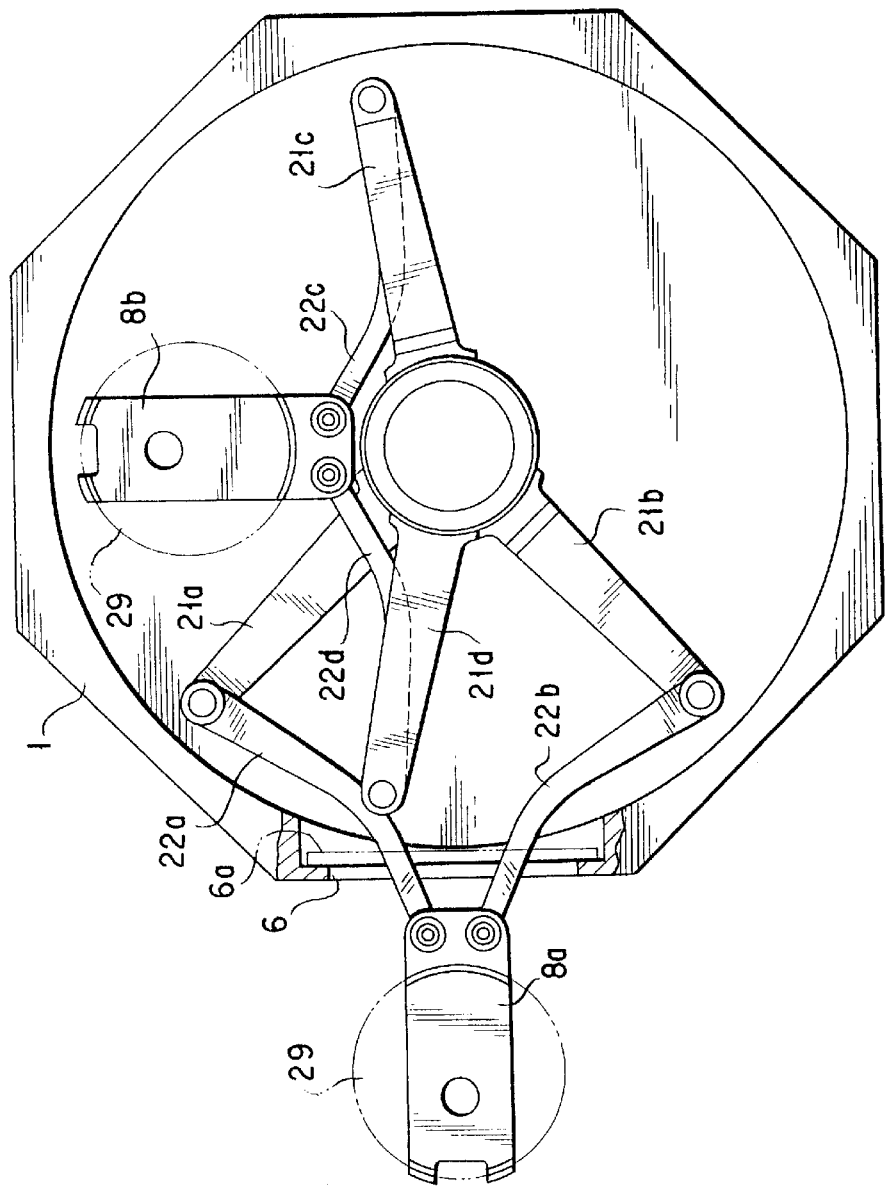
FIG. 11 is a functional explanatory view showing the handling robot according to the present invention.

By way of such a projecting operation as mentioned above, the transfer table 8a and the respective leading ends of the links 22a and 22b will be projected into any one of the stations from a gate 6 provided in the partition wall 5 of the transfer chamber 1. Therefore, a wafer 29 which comprises a semiconductor blank that has been mounted on the transfer table 8a may be carried into the station, as shown in FIGS. 10 and 11.

Also, by way of such a sinking or retracting operation as mentioned above, the wafer 29 in the station will be carried into the transfer chamber 1, and a rotary operation in that a sinking or retracting state will cause the transfer table 8a, 8b to oppose a gate in a preselected station.

Then, the above mentioned two transfer tables 8a and 8b are spaced apart from each other by a distance S in the vertical direction so that they do not interfere with each other when they are rotated as mentioned above. Thus, the gate through which each of them is to be passed is designed to have an opening height so as to enable both the transfer tables 8a and 8b and the links 22a, 22b to be sufficiently passed therethrough.

An above mentioned gate 6 is provided with an opening and closing door 6a as mentioned above. The opening and closing door 6a is designed to perform an opening, and closing operation in conjunction with the operation of the above mentioned transfer tables 8a and 8b, and to remain closed unless it needs to be opened or closed. The transfer chamber 1 is designed to remain in an evacuated state, so each of the stations is evacuated by a suction unit before the door 6a is opened.

In the case of a semiconductor manufacturing system, each electrical property of a semiconductor must be kept secured with precision by using a thin film thereof in the order of nanometers. Thus, in its manufacturing process, it becomes critical to enhance the quality of such a film in conjunction with the enhancement of the integration and function levels of an element. If such a film absorbs the molecules of an unnecessary gas, it is altogether possible that the film may be deteriorated in its quality and its essential properties, and reliability may be seriously lowered.

For this reason, the conveyance of a wafer from the transfer chamber 1 to each of the stations has been carried out in an extremely evacuated state or under an ultra-high vacuum (or in a high purity gaseous atmosphere that is substantially equivalent to an ultra-high vacuum) for the purpose of eliminating any influence whatsoever of a residual gas on the wafer in each of the stations.

It is to this end that, as mentioned above, a gate 6 of the transfer chamber 1 is provided with an opening and closing door 6a. Each gate is designed to be opened and closed by the opening and closing door 6a in conjunction with the projecting and retracting operations of each of the transfer tables 8a and 8b.

The opening and closing door 6a for an above mentioned gate 6 is made substantially larger than the area of the opening of the gate 6, and is adapted to be thrust against the gate 6 so as to provide such a seal that a gas may not be leaked.

A gate 6 should be as small as possible to ensure its enhanced ability to seal.

In the embodiment of the present invention set forth above, however, it should be noted that as has been mentioned, in order to enable a pair of the transfer tables 8a and 8b whose positions are deviated in the vertical direction to be passed therethrough, it happens to ensue that a gate 6 has an unexpected large area, and involves what is desirable with regard to its sealability when it is sealed with the opening and closing door 6a. Also, it should be mentioned that another problem in this connection is that if the area that receives a differential pressure between the transfer chamber 1 and any one of the stations is enlarged, an actuator that is required to thrust the opening and closing door 6a needs to be of an increased output.

In order to resolve these problems, there is provided an arrangement in which the pair of transfer tables may no longer be passed simultaneously through a gate 6, whereby at least one of the transfer tables is displaceable vertically from a position at which they do not interfere with each other when they are rotated to a position of the other transfer table. Thus, the solution of the problems will be the determination of the vertical width of a gate 6 to be a width that is just sufficient for only one of the transfer tables to be passed therethrough.

Figure 14:
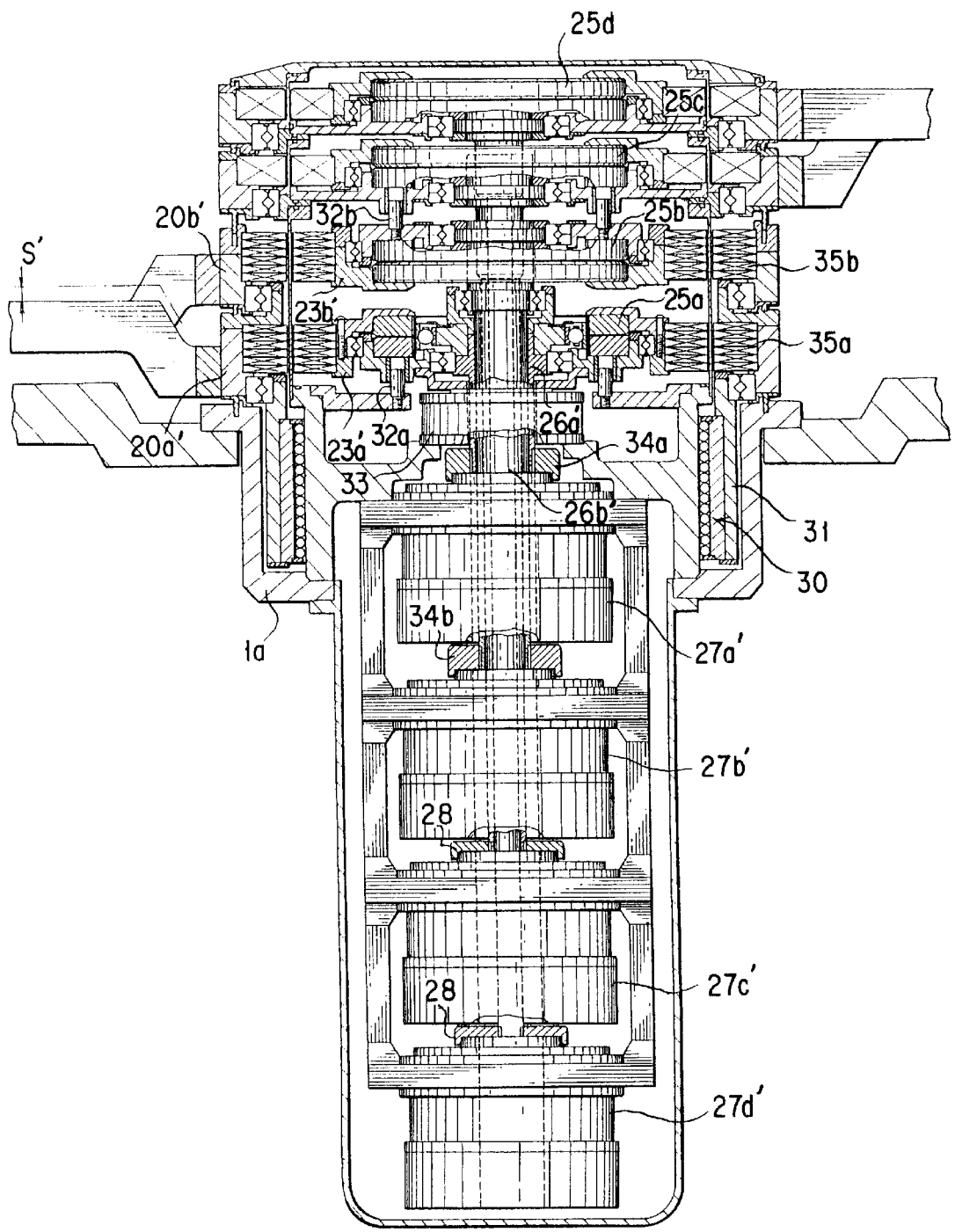
FIG. 14 is a cross sectional view showing a construction in which one transfer table is capable of being displaced towards the central axis of rotation.

FIG. 14 shows an example in which the lower transfer table 8a is vertically displaceable so that a pair of the first and second ring shaped bosses 20a' and 20b' and a pair of the first and second disk shaped bosses 23a' and 23b' may be moved as a whole vertically by a distance S' which represents the height of the above mentioned vertical deviation.

More specifically, the ring shaped boss 20a' that is located at the lowermost position is rotatably supported by a vertical displacement member 31. This member 31 is supported so as to be vertically displaceable over the above mentioned distance S' via a vertical displacement guide means 30 which is made of a linear ball bush, with respect to the frame 1a of the transfer chamber 1.

Above the first ring shaped boss 20a', there is supported the second ring shaped boss 20b' so as to be rotatable integrally therewith in the vertical direction.

On the other hand, the first and second disk shaped bosses 23a' and 23b' are integral with each other in their vertical direction via a pair of speed reduction gears 25a and 25b disposed inside thereof. A reduction gear fixing member of the first and lower speed reduction gear 25a, and a reduction gear fixing member of the second and upper speed reduction gear 25b are supported and engaged with each other via a pair of pins 32a and 32b, respectively, in their rotary direction so as to be displaceable in the vertical direction over the above mentioned distance S', each at the side of the frame 1a of the transfer chamber 1.

An electrically actuated cylinder 33 that makes use of a linear stepping motor is interposed between the above mentioned reduction gear fixing member of the first and lower speed reduction gear 25a and the frame 1a. Therefore, the member may be displaced vertically by the distance S' by means of the electrically actuated cylinder 33.

The respective speed reduction gears 25a and 25b for the above mentioned first and second disk shaped bosses 23a' and 23b' have leading ends of their respective rotary shafts 26a' and 26b' engaged with each other in their rotary direction so as to be slidable via a spline with respect to the respective output shafts 34a and 34b of a pair of motors 27a' and 27b'.

Between the first and second ring shaped bosses 20a' and 20b' and the first and second disk shaped bosses 23a' and 23b', there are provided, respectively, a pair of magnetic couplings 35a and 35b of a linear rotary type, in place of customary magnetic couplings. These couplings 35a and 35b both a force of rotation and an axial force of straight advancement to be transmitted.

In such a construction as mentioned above, by displacing the reduction gear fixing member of the first and lower speed reduction gear 25a upwards by means of the electrically actuated cylinder 33, it can be seen that the pair of ring shaped bosses 20a' and 20b' will be displaced together upwards by the distance S'. Consequently, a first transfer table 8a may be displaced upwards via a pair of arms fastened thereto in order to reach a level that is identical to that of a second transfer table 8b.

Accordingly, by permitting the first transfer table 8a located at the lower side to be lifted up to this position when projected into any one of the stations, it can be seen that the size of a gate 6 in its vertical direction only needs to be a size which enables only one of the single transfer tables 8a and 8b to be passed therethrough.

At this point it should be noted that although only one of the transfer tables is permitted to be displaced vertically in the example shown in FIG. 14, it can also be arranged so that both of the two transfer tables 8a and 8b may be displaced as a whole vertically.

Several examples of the present embodiment of the invention will be explained below with reference to FIGS. 15 to 19.

The example in which the bosses in a set are vertically moved as a whole (FIG. 15) is as follows. The first, second, third and fourth disk shaped bosses 23a to 23d are arranged so as to be rotatable independently of one another and are coupled together in an axial direction. Similarly, the ring shaped bosses 20a to 20d which oppose the disk shaped bosses 23a to 23d, respectively, via the magnetic couplings of the linear rotary type, are arranged so as to be rotatable independently of one another and are coupled together in an axial direction.

The ring shaped boss 20a and the disk shaped boss 23a are supported so as to be slidable axially via a linear guide 30a on a lower cylindrical member 41 that is fastened to a side of the frame 1a.

Also, the fourth ring shaped boss 20d and the disk shaped boss 23d are supported so as to be slidable axially via a linear guide 30b on an upper cylindrical member 42. The upper cylindrical member 42 is coupled to a partition wall 17 which is fastened to the above mentioned lower cylindrical member 41.

Also, since the speed reduction gears 25a to 25d (which are disposed inside of the above mentioned disk shaped bosses 23a to 23d) are supported on the disk shaped bosses 23a to 23d, they are capable of being displaced axially in an integration with the disk shaped bosses 23a and 23d. Also, the fixing member of the first speed reduction gear 25a is coupled via a bracket 43 to an electrically actuated cylinder 33 that makes use of a linear stepping motor. The respective fixing members of the other speed reduction gears 25b to 25d are each coupled to the fixing member of the first speed reduction gear 25 in their rotary direction. Also, the fixing member of the fourth and uppermost speed reduction gear 25d is coupled to a pin so as to be slidable axially with respect to a cover 44 that is integral with the above mentioned upper cylindrical member 42.

On the other hand, the respective input end sides of the rotary shafts 26a to 26d which are coupled to the respective input members of the speed reduction gears disposed inside of the above mentioned disk shaped bosses, respectively, are engaged with the respective output sections of the motors 27a' and 27d', respectively, via four splines so as to be axially slidable.

In the construction of this example, it can be seen that the bosses as a whole are vertically displaced by the extension and retraction operations of the electrically actuated cylinders 33.

By operating, at both of the positions, the motors 27a' and 27b' in a predetermined manner, it can be seen that each of the transfer tables 8a and 8b will be opposed to a gate 6 corresponding thereto to perform a predetermined operation.

Figure 9:
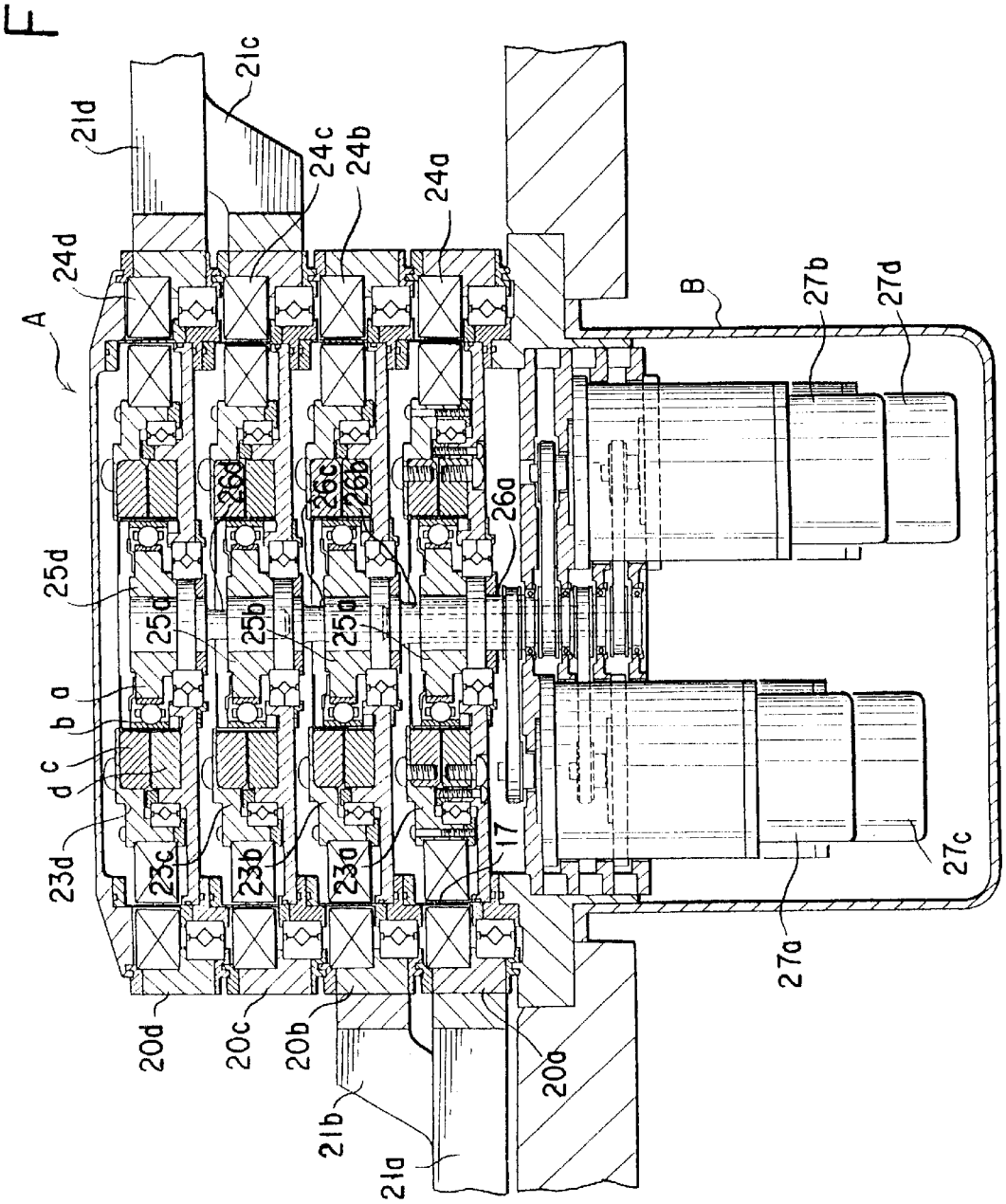
FIG. 9 is a cross sectional view illustrating an arm rotary mechanism of a certain embodiment of the handling robot according to the present invention.

An example in which an entire boss section containing a drive unit is vertically displaced (FIG. 16) is described as follows. In this example, a case 46 in which the motors 27a to 27d of a handling robot A shown in FIG. 9 are received is supported via a linear guide 45 within the frame 1a so as to be vertically displaceable by the above mentioned stroke S. The case 45 is adapted to be driven by an electrically actuated cylinder 33. It should be noted in this case that the case 46 which is fitted in the frame 1a so as to be slidable is engaged with a pin 1b so that it may not be rotated with respect to the said frame 1a.

In order to prevent dust from intruding from the linear guide portion 45 into the transfer chamber 1, it is seen that a bellows 46a is interposed between the case 46 and the frame 1a.

A boss section vertically displaced by a cam mechanism (FIGS. 17 to 19) is next described. A set of the first to fourth ring shaped bosses 20a to 20d and a set of the first to fourth disk shaped bosses 23a to 23d are each axially slidable.

A first cam ring 47a is fastened to the output portion of the first speed reduction gear 25a, and a cam follower 50a that is provided for the first disk shaped boss 23a via a supporting rod 49a is engaged with a cam slot 48a that is provided in the cam ring 47a A guide pin 51a that protrudes from the said first cam ring 47a is fitted in the second disk shaped boss 23b so as to be axially slidable.

A second cam ring 47b is fastened to the output portion of the second speed reduction gear 25b, and a cam follower 50a that is provided for the second disk shaped boss 23b via a supporting rod 49b is engaged with a cam slot 48b that is provided in the cam ring 47b. A guide pin 51b that protrudes from the second cam ring 47b is fitted in the first disk shaped boss 23a so as to be axially slidable.

A third cam ring 47c is fastened to the output portion of the third speed reduction gear 25c, and a cam follower 50c that is provided for the third disk shaped boss 23c via a supporting rod 49c is engaged with a cam slot 48c that is provided in the cam ring 47c. A guide pin 51c that protrudes from the second cam ring 47c is fitted in the fourth disk shaped boss 23d so as to be axially slidable.

A fourth cam ring 47d is fastened to the output portion of the fourth speed reduction gear 25d, and a cam follower 50d that is provided for the fourth disk shaped boss 23d via a supporting rod 49d is engaged with a cam slot 48d that is provided in the cam ring 47d. A guide pin 51d that protrudes from the fourth cam ring 47d is fitted in the third disk shaped boss 23c so as to be axially slidable.

Figure 17:
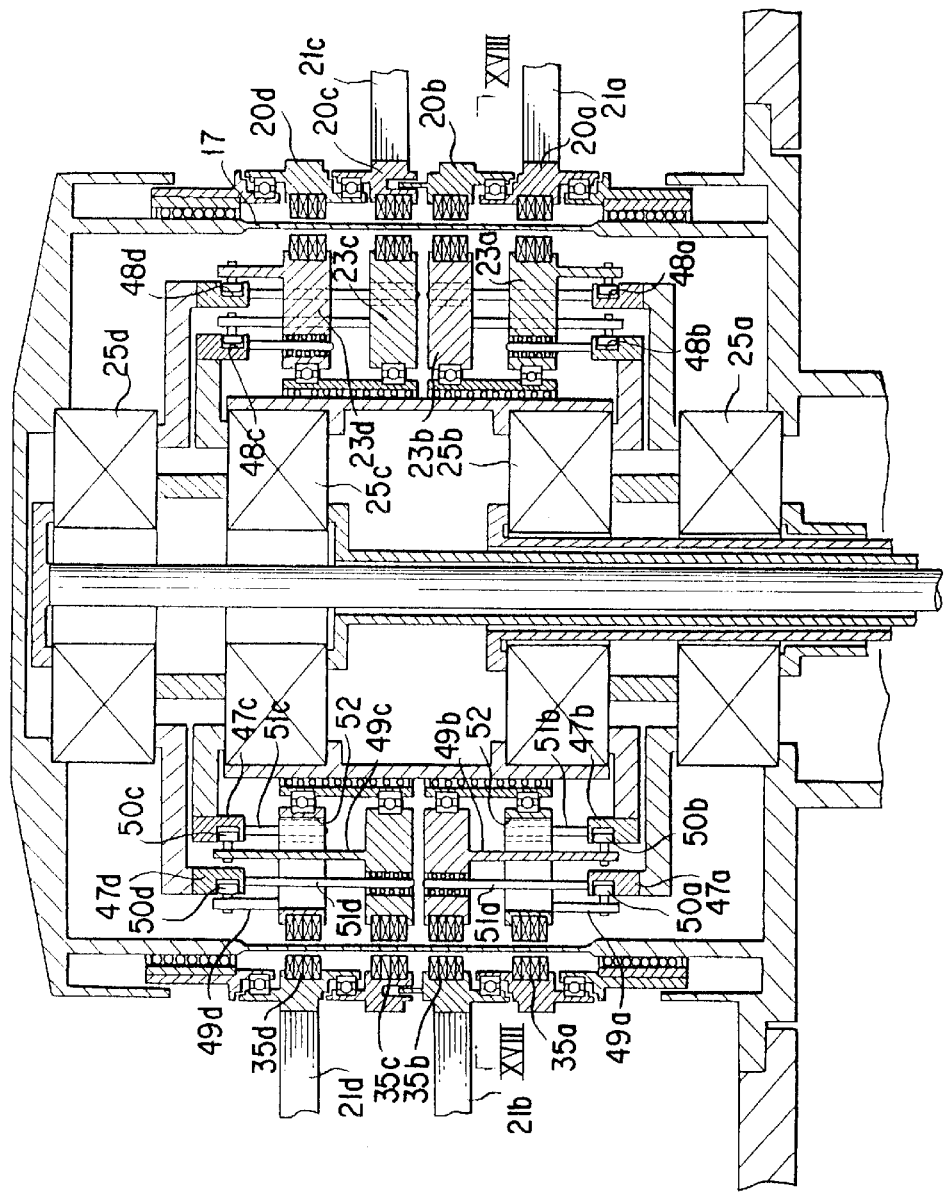
FIG. 17 is a cross sectional view showing the construction in which all of the bosses are capable of being displaced towards the central axis of rotation.
Figure 18:
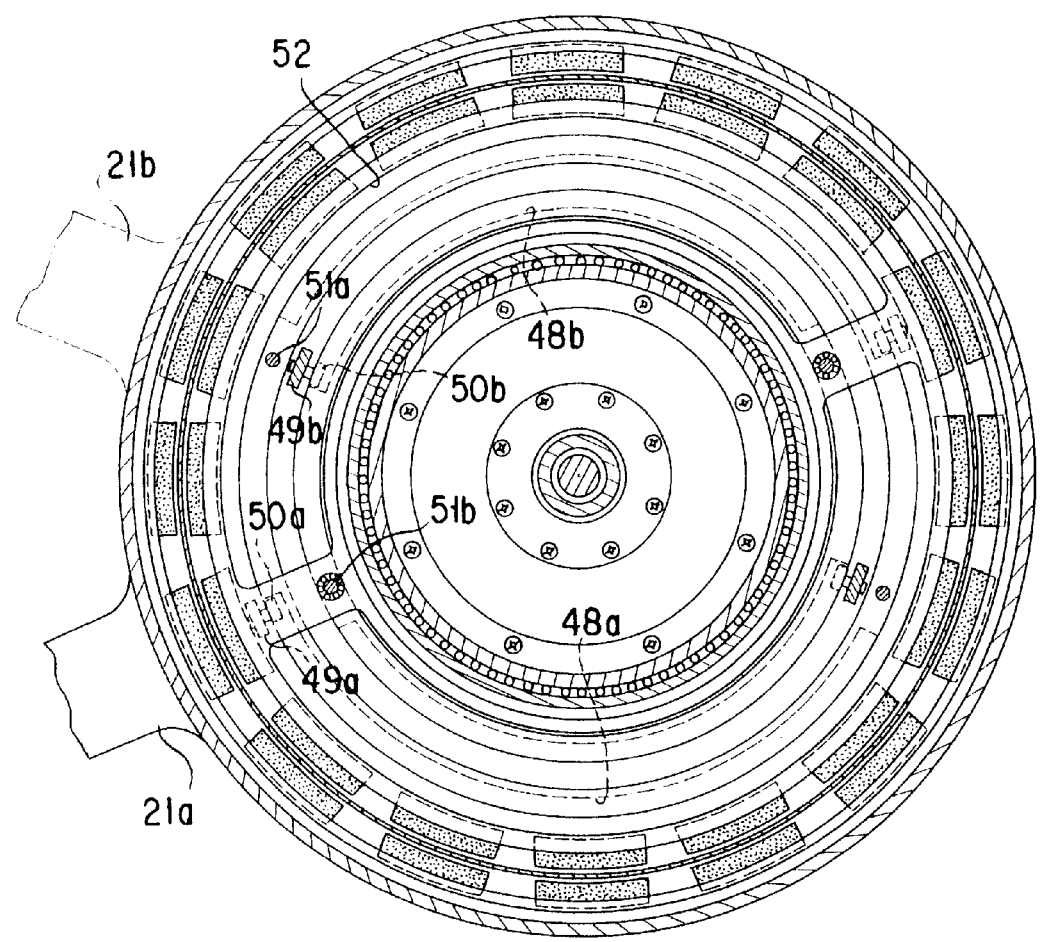
FIG. 18 is a cross sectional view taken along the line XVIII—XVIII in FIG. 17.

As shown in FIGS. 17 and 18, the first and fourth disk shaped bosses 23a and 23d are each provided with a space 52 through which the guide pin 51a (51d) and the supporting rod 49b (49c) of the cam follower pass. The spaces prevent the pins from interfering with the disk shaped bosses when these bosses are each rotated.

An explanation will now be given with respect to the functions in this construction and the shape of each of the said cam slots 48a and 48b with reference to FIG. 19.

If the first cam ring 47a is rotated rightwards by ω1 via the first speed reduction gear 25a, and the second cam ring 47b is likewise rotated leftwards by ω1 via the said second speed reduction gear 25b. Then, the second disk shaped boss 23b and the first disk shaped boss 23a which are coupled thereto via the guide pins 51a and 51b, respectively, will be rotated rightwards and leftwards, respectively. This will cause the first and second ring bosses 20a and 20b positioned outside thereof to be rotated via the magnetic couplings of linear rotary type 35a and 35b, respectively, in their respective directions in which the arms 21a and 21b approach each other.

This will in turn cause the cam follower 50a that is provided for the first disk shaped boss 23a to be displaced within the cam slot 48a and then to be lifted up by the distance S and the cam follower 50b that is provided for the second disk shaped boss 23b to be likewise displaced within the cam slot 48b by a predetermined distance. Thereby, both of the disk shaped bosses 23a and 23b will be lifted by the distance S. This will further cause the first and second ring shaped bosses 20a and 20b to follow the above mentioned displacements so as to be lifted up via the magnetic couplings of linear rotary type 35a and 35b. Thus, the first transfer table 8a can be opposed to a gate 6 within the transfer chamber 1.

Further, if the pair of disk shaped bosses 23a and 23b are rotated by ω2 and ω2, the first and second ring shaped bosses 20a and 20b will be rotated via magnetic couplings of linear rotary type, respectively. Therefore, the transfer table 8a will maintain its height and be moved so as to be projected into a process chamber.

If the pair of disk shaped bosses are rotated from this state by ω2 oppositely to each other, then the transfer table 8a will be moved so as to be sunk or retracted into the transfer chamber 1. Then, if they are likewise rotated further by ω1, the lower transfer table 8a will be displaced downwards by the above mentioned distance S so as to deviate in position from the said gate 6.

The third and fourth cam slots 48c and 48d located upwards, and the first and second cam slots 48a and 48b located downward are oriented in opposite directions. If the ring shaped bosses 20c and 20d are rotated by ω1 via the speed reduction gears 25c and 25d in the opposite directions in which the arms 21c and 21d approach each other, the disk shaped bosses 23c and 23d will be moved downward by the above mentioned distance. This will cause the upper transfer table 8b to be displaced downward within the transfer chamber 1 so as to oppose a gate 6. If they are likewise rotated further by ω2, the upper transfer table 8b will be projected from the gate 6 into a process chamber. If they are rotated oppositely with respect to each other, the transfer table 8b will be sunk or retracted in the transfer chamber 1 while being displaced upwards so as to deviate in position from the gate 6.

A transfer table vertically displaced is described as follows.

Figure 20A:
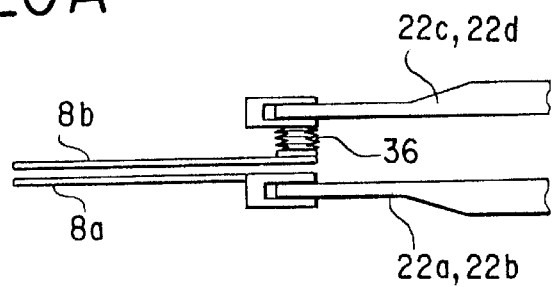
FIGS. 20A and 20B are each a functional explanatory view showing a construction in which a transfer table is capable of being displaced towards the central axis of rotation.
Figure 20B:
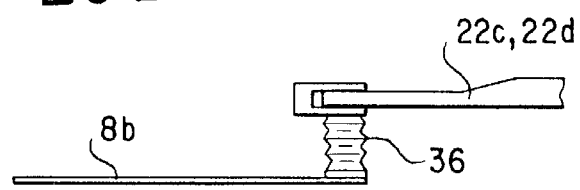

In order to coincide the height of one of the two transfer tables with the height of the other, there may be provided an arrangement, as shown in FIG. 20A, in which an extender and retractor unit 36 that comprises a screw or a cylinder mechanism which is adapted to extend and retract vertically is provided where the transfer table 8b is coupled to the links 22a and 22b of a transfer table attitude regulating mechanism. The transfer tables 8a and 8b are made identical in level by permitting the unit 36 to be elongated as shown in FIG. 20B.

In the construction in which at least one of the transfer tables 8a, 8b is displaced in the axial direction of the previously mentioned center of rotation, it should be noted that in a case where there are three or more transfer tables, any arrangement that permits only one of them to be displaced will not allow a gate 6 to be minimized in its height (i.e., to have a height with which only one of the transfer tables is allowed to pass therethrough).

Figure 21:
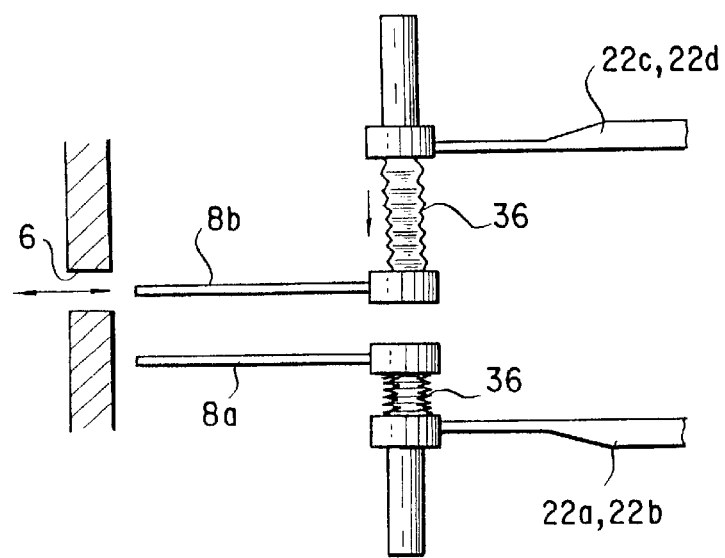
FIG. 21 is a functional explanatory view showing a construction in which a transfer table is capable of being displaced towards the central axis of rotation.

For this reason, there should be provided an arrangement, as shown in FIG. 21, in which each of the transfer tables is coupled to its respective arm via one of the extender and rectractor units respectively and is displaced thereby. Therefore, each such transfer table may individually be oppose to a gate 6 which is minimized in height.

A link vertically displaced is described below.

Figure 22:
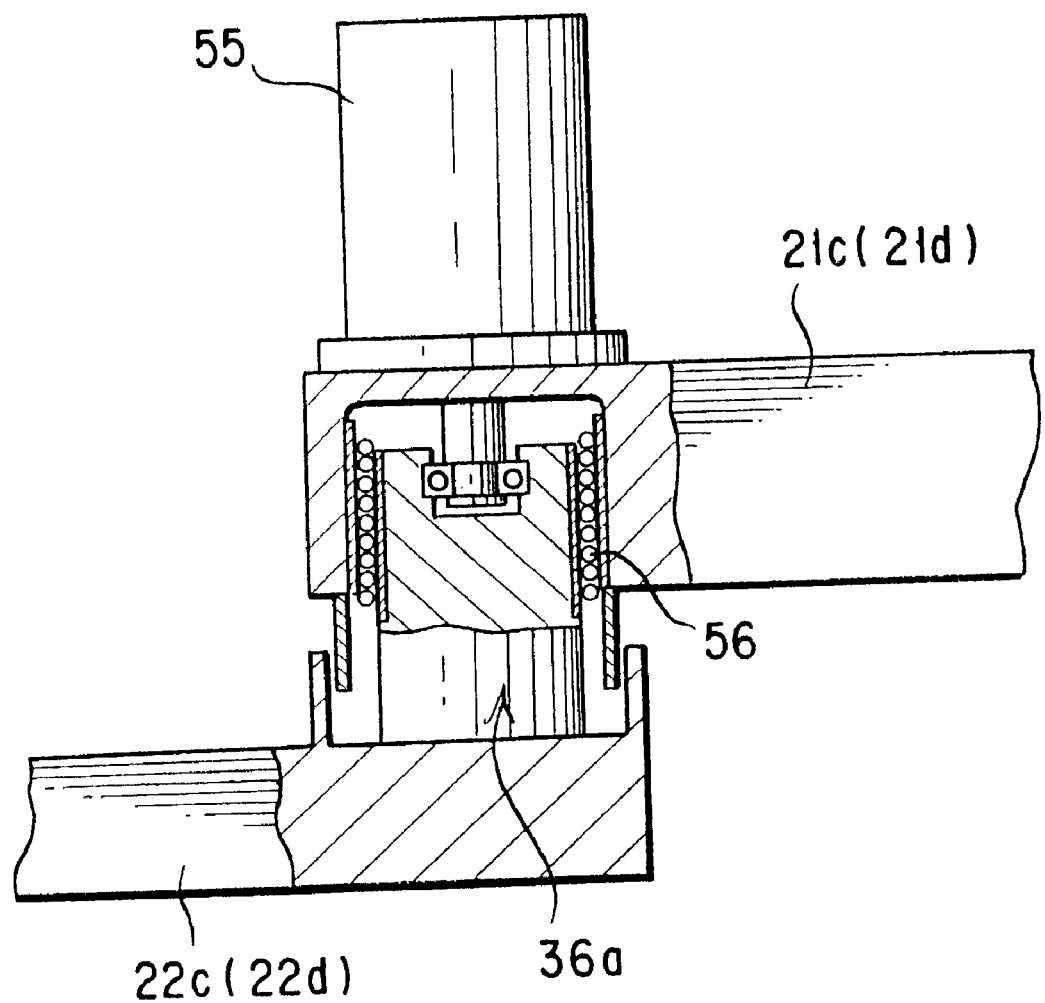
FIG. 22 is a cross sectional view showing a mechanism for displacing a link with respect to an arm in the axial direction.

In order to allow the above mentioned transfer tables 8a and 8b to be vertically displaced, there may be provided an arrangement, for example, as shown in FIG. 22, in which the links 22c and 22d are coupled via an extender and retractor unit 36a to the respective leading ends of the third and fourth arms 21c and 21d.

In a construction as shown here, reference numeral 55 designates a linear actuator, and reference numeral 56 denotes a linear rotary ball bearing. It can be seen that the links 22c and 22d will be vertically displaced by the extension and retraction operation of the linear actuator, and will allow the transfer table 8b to be vertically displaced thereby.

Figure 23:
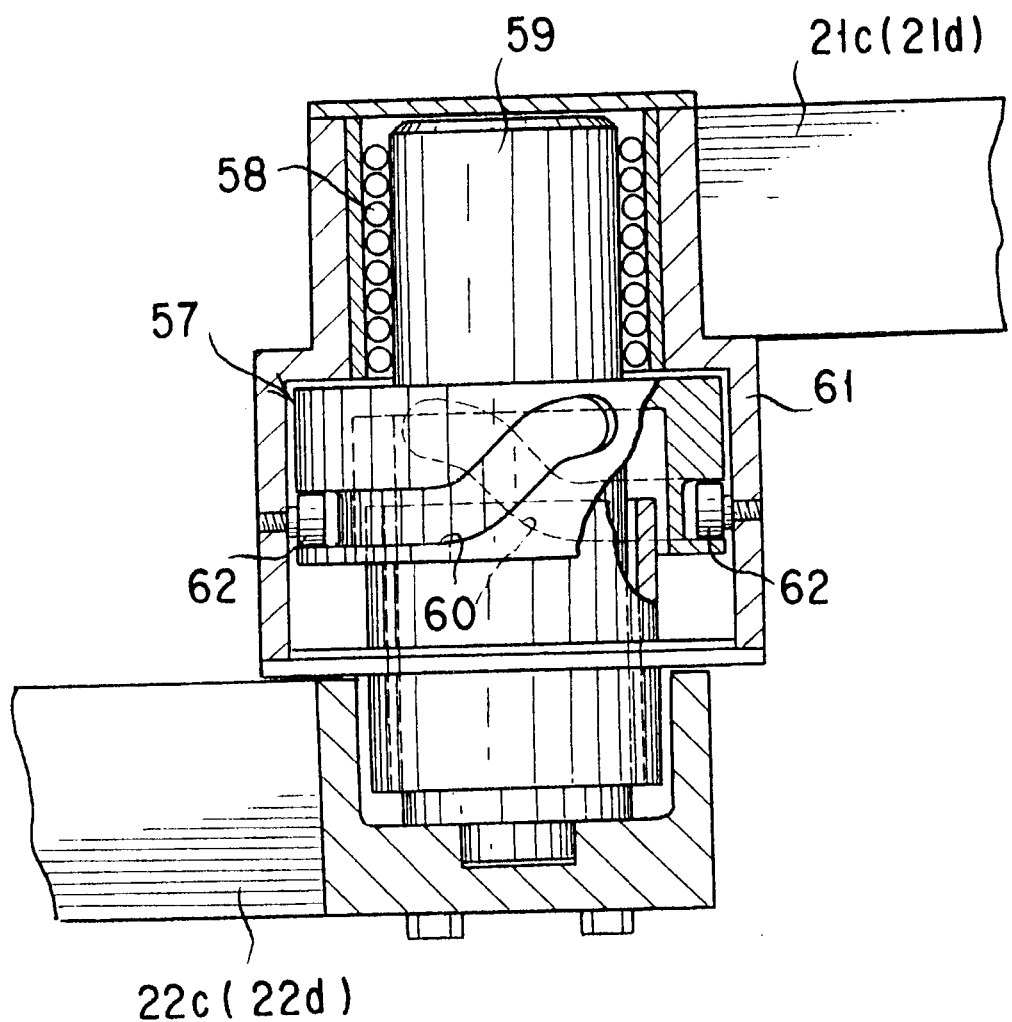
FIG. 23 is a cross sectional view showing another mechanism for displacing a link with respect to an arm in the axial direction.

FIG. 23 shows another example of the extension and retraction unit for vertically displacing the links 22c and 22d with respect to the above mentioned arms 21c and 21d, in which a cam mechanism 57 is used in place of the linear actuator 55.

More specifically, a cam shaft 59 is supported via a linear rotary ball bearing 58 by the leading end of the arm 21c (21d). The link 22c (22c) is integrally fastened to the leading end of the cam shaft 59. A pair of cam slots 60 and 60 are symmetrically provided on both surfaces of the cam shaft 59, and are fitted with a pair of cam followers 62 and 62 which are provided in a cylindrical member 61 that is fastened to the arm 21c (21d).

A cam slot 60 and a cam follower 62 are related to each other in such a manner that in a terminal state of the operation in which the transfer table 8b is sunk or retracted, it may, when within the transfer chamber 1, be vertically deviated in position from a gate 6. When the transfer table is operatively projected slightly from its terminal position of such a sinking or retracting operation, the transfer table 8b may be vertically displaced so that the transfer table 8a, 8b can assume the height of the gate 6 so as to be projected into a process chamber immediately before the leading end of the transfer table 8b reaches the peripheral wall of the transfer chamber 1. It should be noted that this operation is identical for the other transfer table 8a as well.

Figure 24:
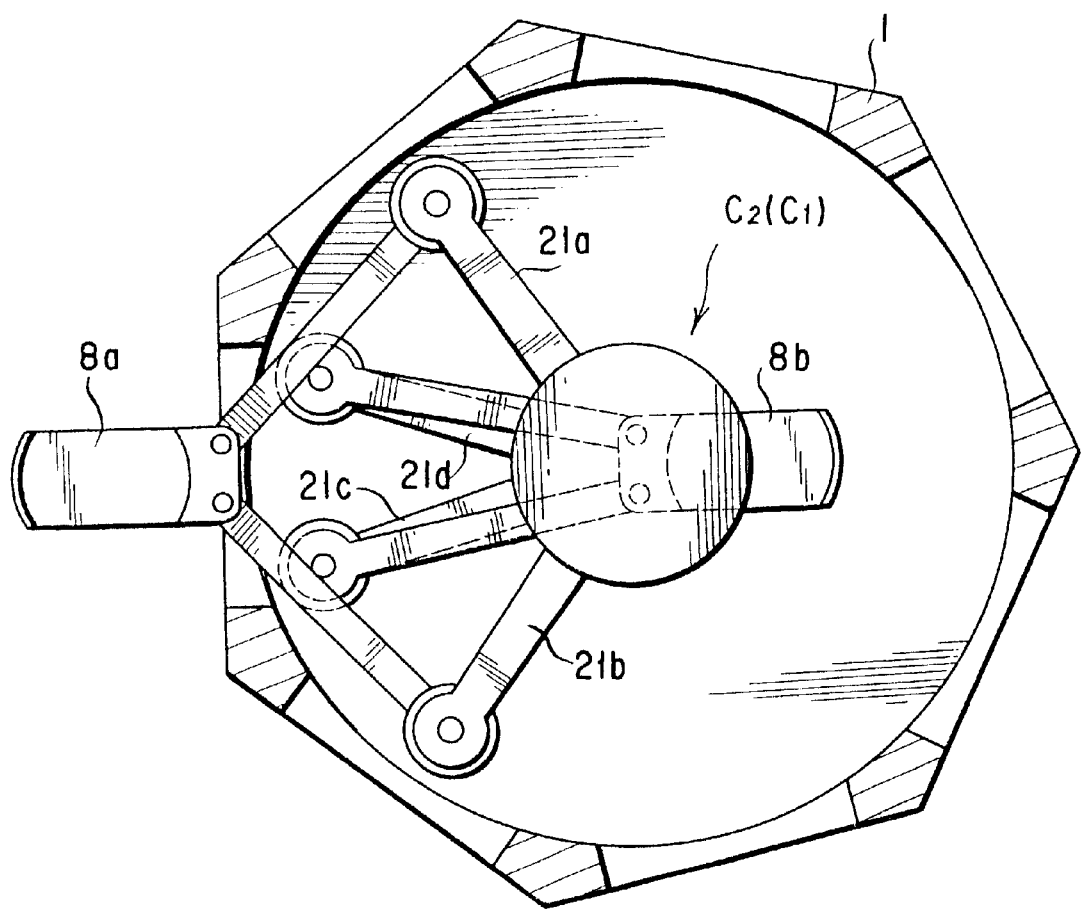
FIG. 24 is a top plan view showing an example of the construction in which the boss section is divided in the axial direction.
Figure 25:
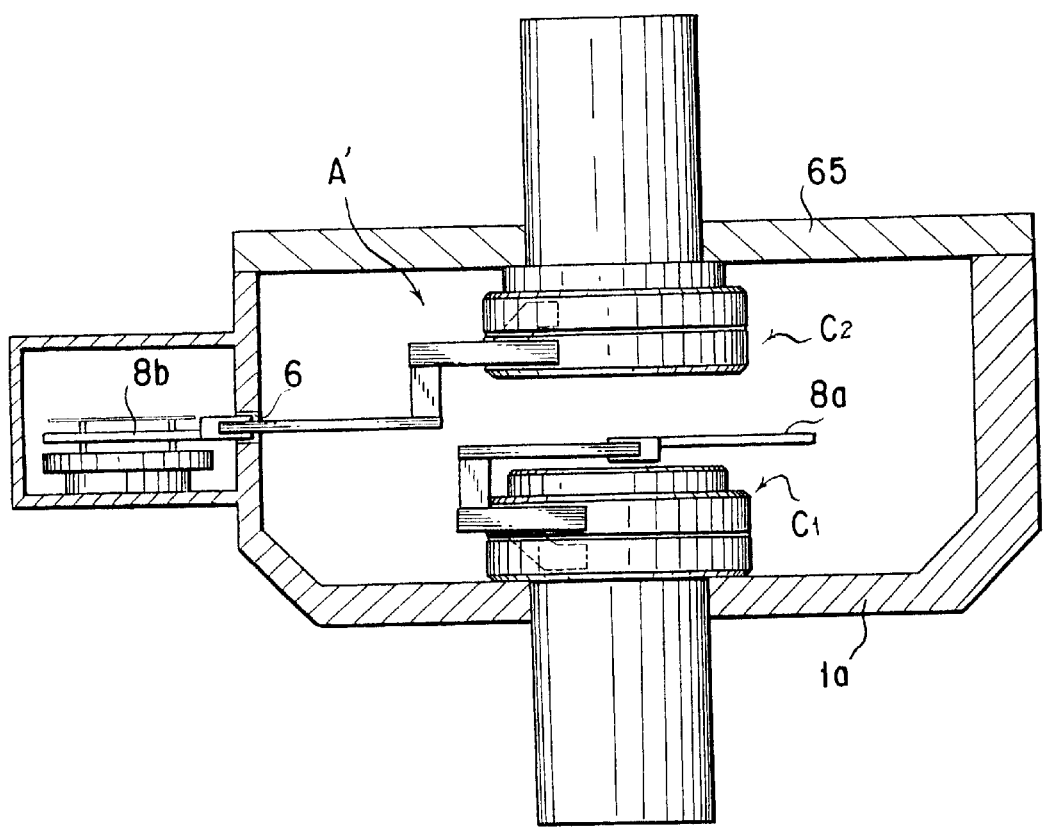
FIG. 25 is a front view showing an example of the construction in which the boss section is divided in the axial direction.

An explanation has hereinbefore been given with respect to each of a variety of examples of the first embodiment of the present invention having a construction in which a series of the first, second, third and fourth ring shaped bosses 20a to 20d (each with a drive unit) are laid one above another to constitute a boss section that is supported on the frame 1a at a bottom side of the transfer chamber 1. It should be noted here that alternatively, such a boss section may, as shown in FIGS. 24 and 25, be divided vertically into a first boss section that is comprised of the first and second ring shaped bosses 20a and 20b, and a second boss section that is comprised of the third and fourth ring shaped bosses 20c and 20d. The first boss section, which is lower, may be arranged to be opposed to the frame 1a at the bottom of the transfer chamber 1. The second section, which is higher, may be arranged to be opposed to a chamber cover 65 for closing the upper side of the transfer chamber 1. The two boss sections are disposed coaxially with each other.

According to this alternative example, four drive units are divided into two pairs which are located up and down, thus permitting each of the drive units to be readily assembled and maintained.

Several constructions of a handling robot A' are shown in FIGS. 25 to 29. In each of these constructions, the drive units are divided into two pairs that are located up and down.

An example in which at least one of the two boss sections is vertically displaced (FIGS. 25 and 26) will be described.

Figure 15:
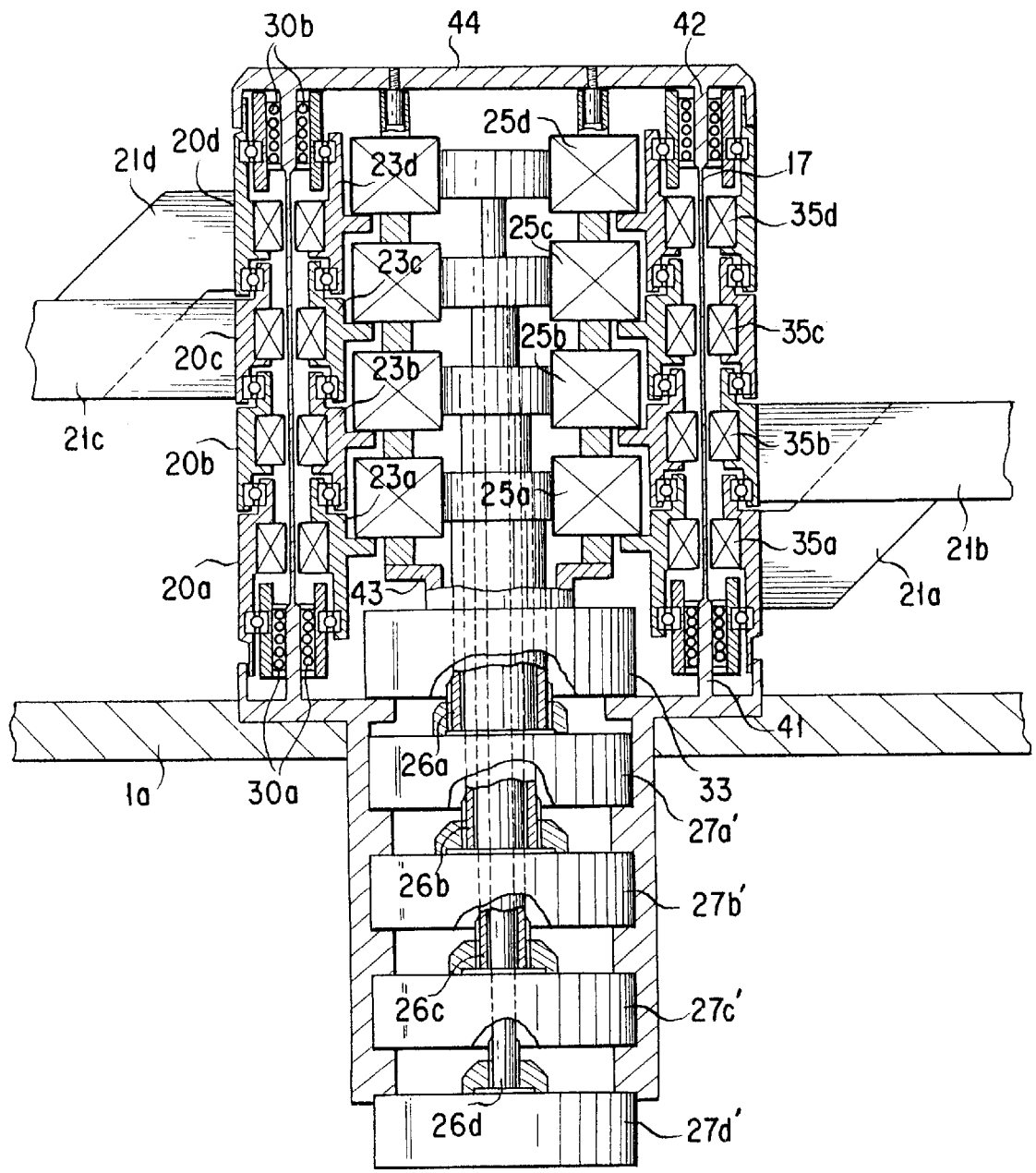
FIG. 15 is a cross sectional view showing the construction in which all of the bosses are capable of being displaced towards the central axis of rotation.
Figure 16:
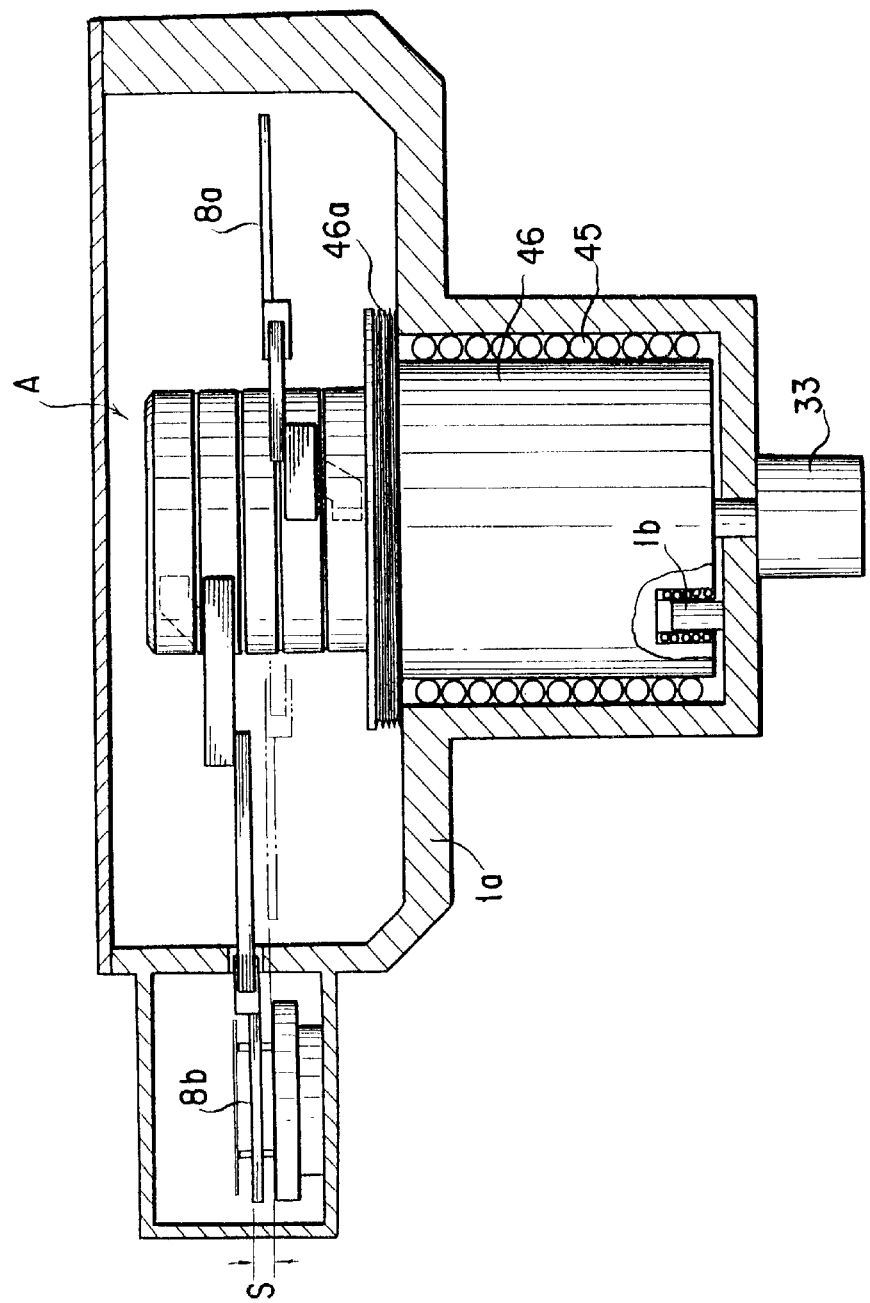
FIG. 16 is a cross sectional view showing the construction in which all of the bosses are capable of being displaced towards the central axis of rotation.

This example corresponds to an arrangement, as shown in FIG. 15, in which a boss section (an entirety of the bosses) is vertically displaced. It represents an example in which the arrangement of FIG. 15 is vertically divided into a lower boss section C1, for driving the first and second ring shaped bosses 20a and 20b, and an upper boss section C2, for driving the third and fourth ring shaped bosses 20c and 20d.

Figure 26:
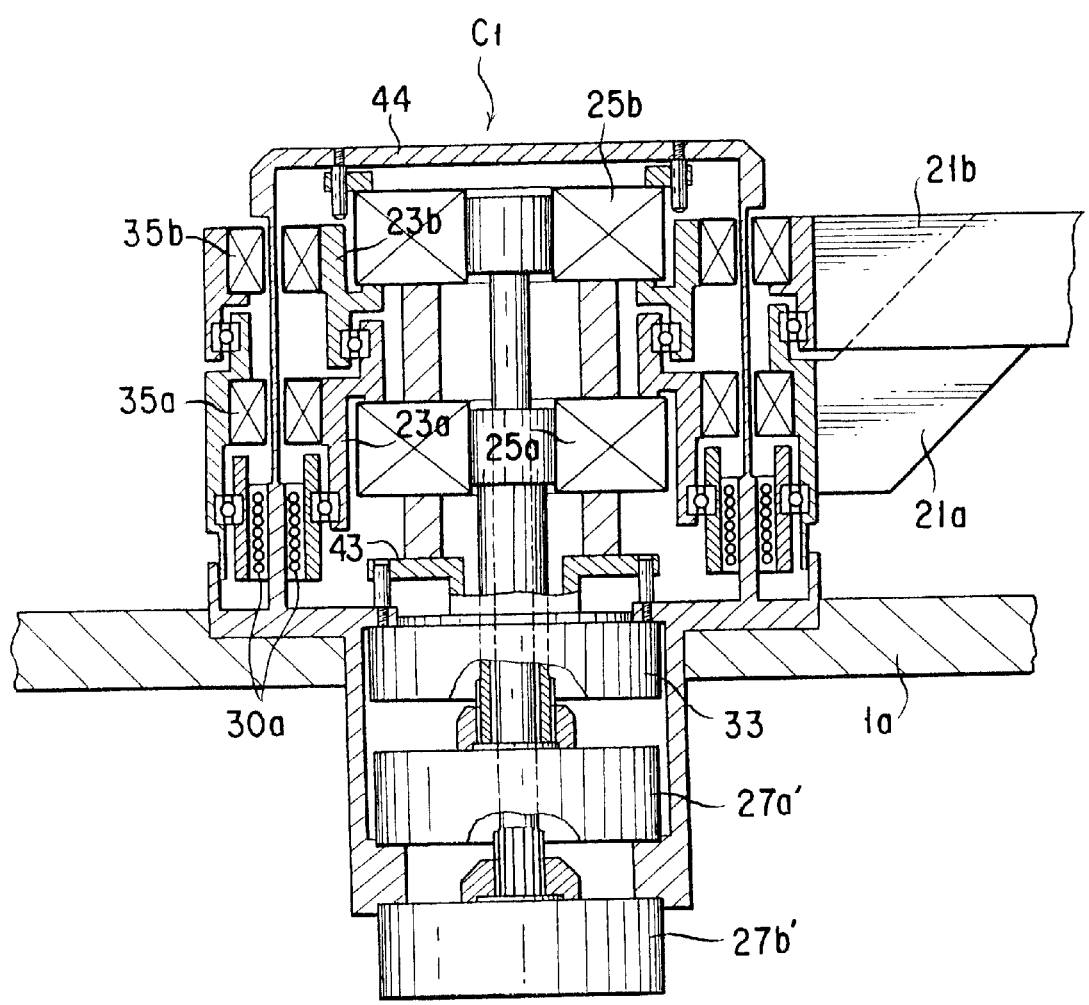
FIG. 26 is a cross sectional view showing one of individual bosses into which the boss section in divided in the axial direction.

FIG. 26 shows the lower boss section C1, whose construction is substantially identical to the construction of FIG. 15, in which the first and second disk shaped boss sections 23a and 23b are driven. It should be noted that the reference numeral and characters individually and in combination represent the same components or parts.

On the other hand, the upper boss section C2 has substantially the same construction as the construction of the lower boss section that is located below it, and they are fastened to the chamber cover 65 opposite each other.

According to this construction, each of the transfer tables 8a and 8b is vertically displaced by driving an electrically actuated cylinder 33 for both the boss sections C1 and C2. At the end of its displacement, it is arranged so as to oppose to a gate 6 of the transfer chamber 1.

Figure 27:
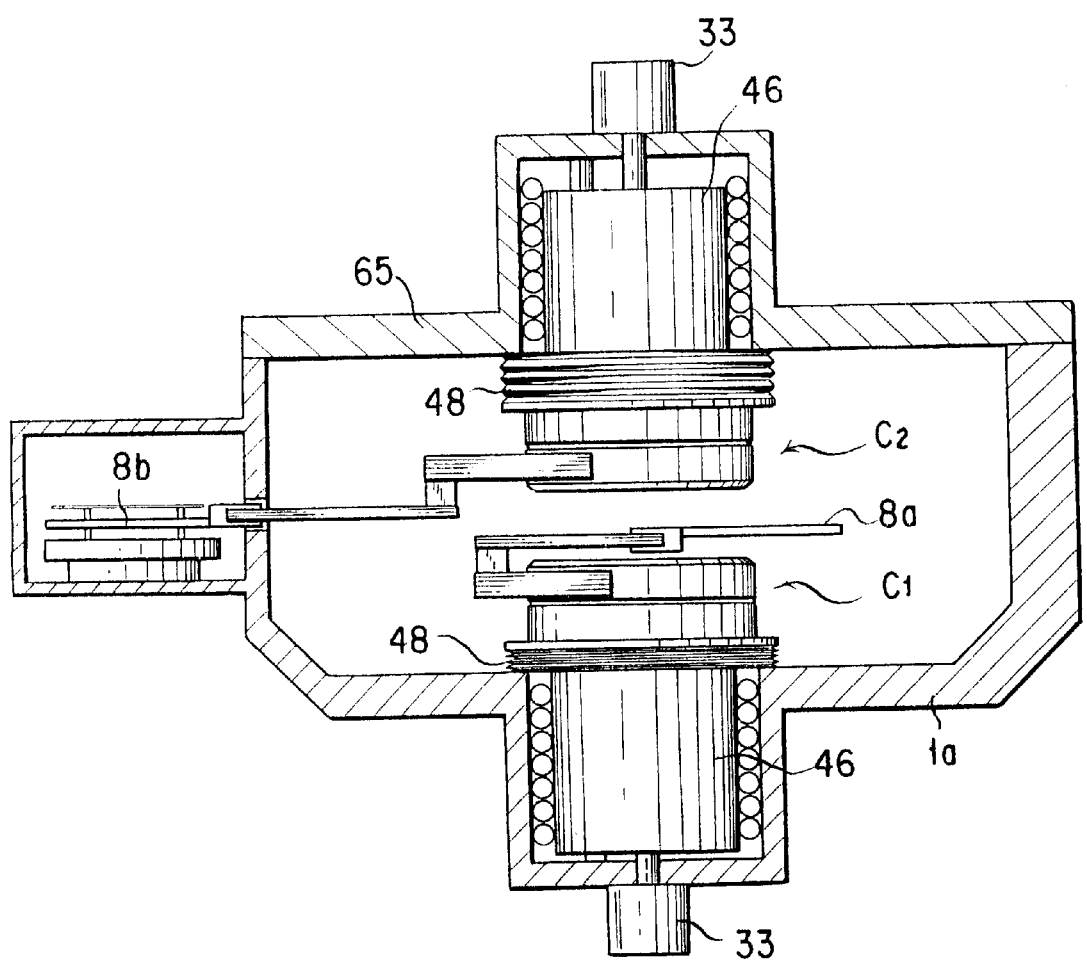
FIG. 27 is a cross sectional view showing an example in which the boss section is divided in the axial direction into individual bosses which are capable of being displaced in the axial direction.

Each of the upper and lower boss sections or at least one thereof including a drive unit is vertically displaced in its entirety (FIG. 27) as shown in FIG. 27. This example corresponds to the form of FIG. 16 in which an entire boss section is vertically displaced, and has a lower and a upper boss section C1 and C2, including cases which contain their respective drive units, vertically displaced in their entireties, respectively, by an electrically actuated cylinder 33, 33. The boss sections C1 and C2 are arranged so as to oppose the frame 1a and the chamber cover 65 of the transfer chamber 1 downwards and upwards, and are vertically displaced by the electrically actuated cylinders 33 and 33, respectively. This will allow each of the transfer tables 8a and 8b to oppose to a gate 6.

Figure 28:
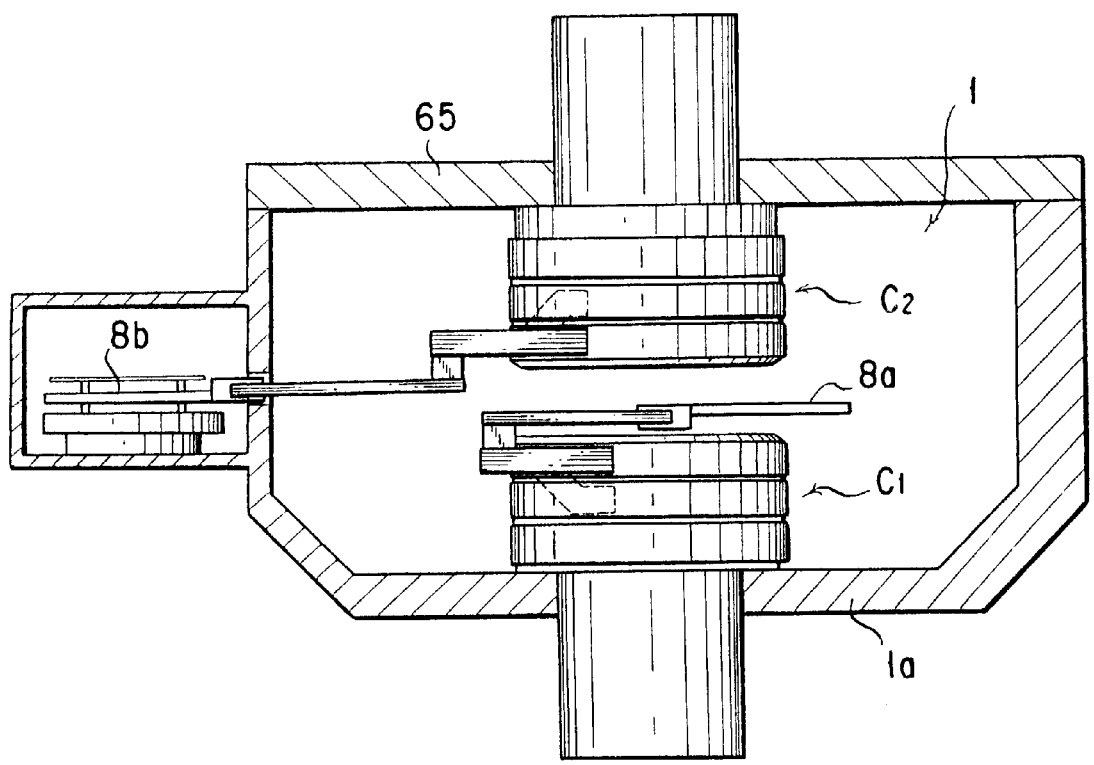
FIG. 28 is a front view showing an example in which the boss section is divided in the axial direction into individual bosses which are capable of being displaced in the axial direction by using a cam mechanism.
Figure 29:
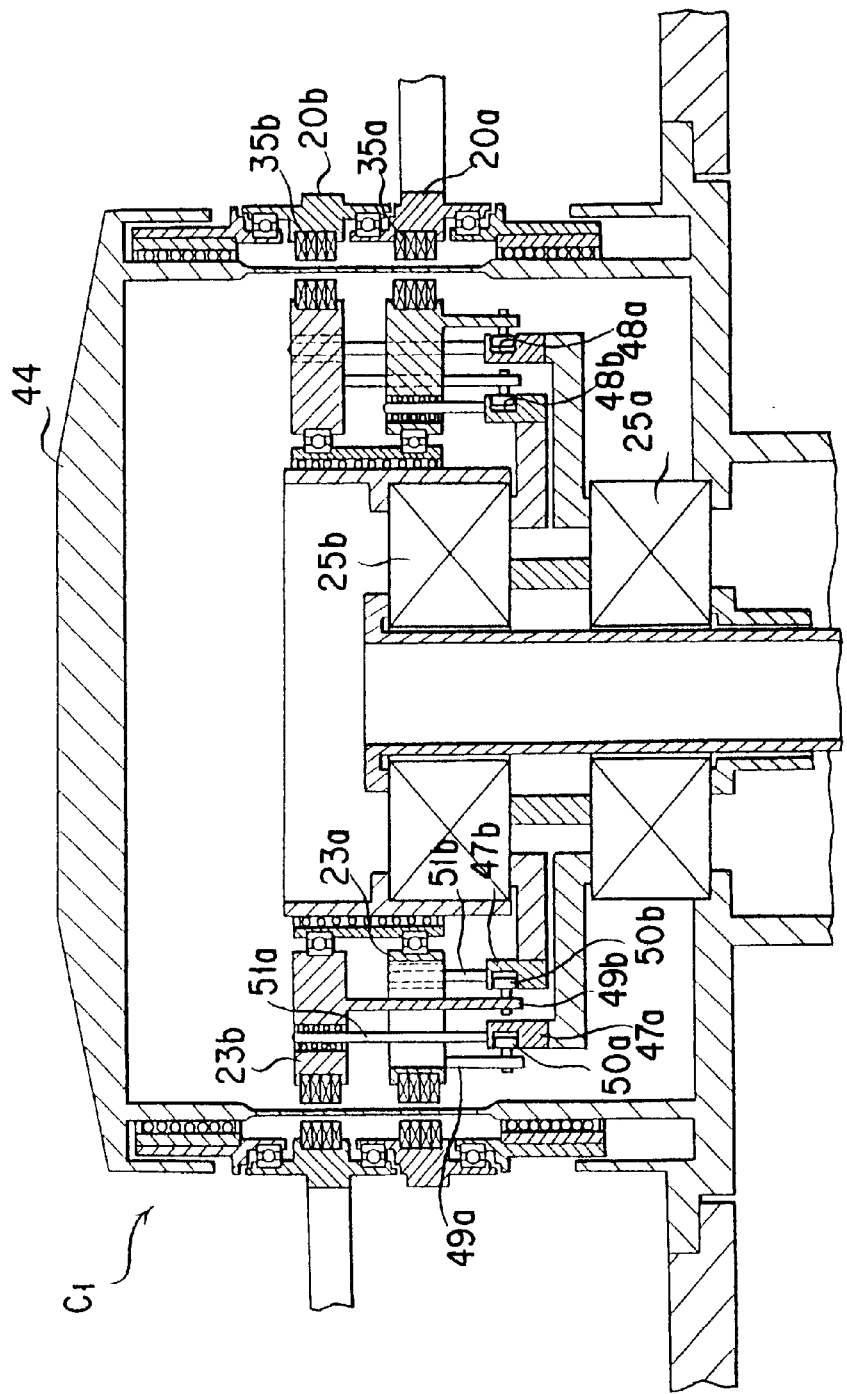
FIG. 29 is a cross sectional view showing one part of the boss section shown in FIG. 28.

The next example is one in which each of the upper and lower boss sections (or at least one thereof is vertically displaced by a cam mechanism (FIGS. 28 and 29).

Figure 19:
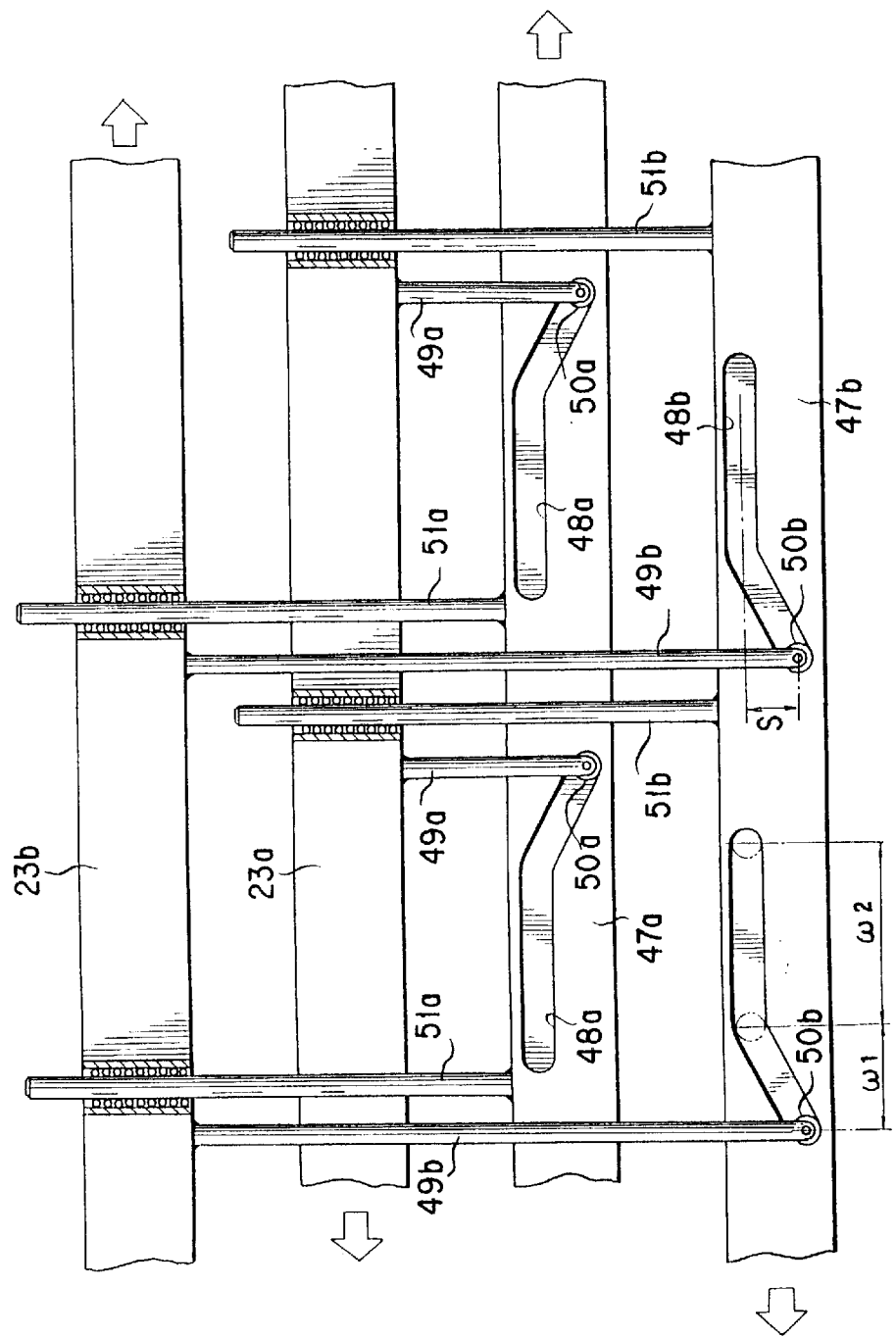
FIG. 19 is a developed explanatory view showing the essential part of an example shown in FIG. 17.

This example represents a construction in which the boss section constructed as shown in FIGS. 17 to 19 is vertically divided into a first boss section comprised of the disk shaped bosses 23a and 23b, and their respective drive units, and a second boss section comprised of the disk shaped bosses 23c and 23d, and their respective drive units. The drive units for driving the disk shaped boss 23a to 23d, respectively, are constructed here in an identical fashion to that in the previous construction, and the same reference numerals and characters individually and in combination designate the same components or parts.

According to this construction, the lower and upper boss sections C1 and C2 are each vertically displaced by a cam mechanism.

Further, even in the construction here in which the upper and lower boss sections divided are provided, there may be no vertical displacement of each of the boss sections C1 and C2. However, a portion of articulation at which an arm and a link are coupled together may be vertically displaced at the link side by an extender and retractor unit 36a or a cam mechanism 57 as shown in FIGS. 22 and 23 described previously. Alternatively, a transfer table and a portion at which the transfer table and a link are coupled together may each be vertically displaced by using a displacement mechanism attached thereto.

Figure 30:
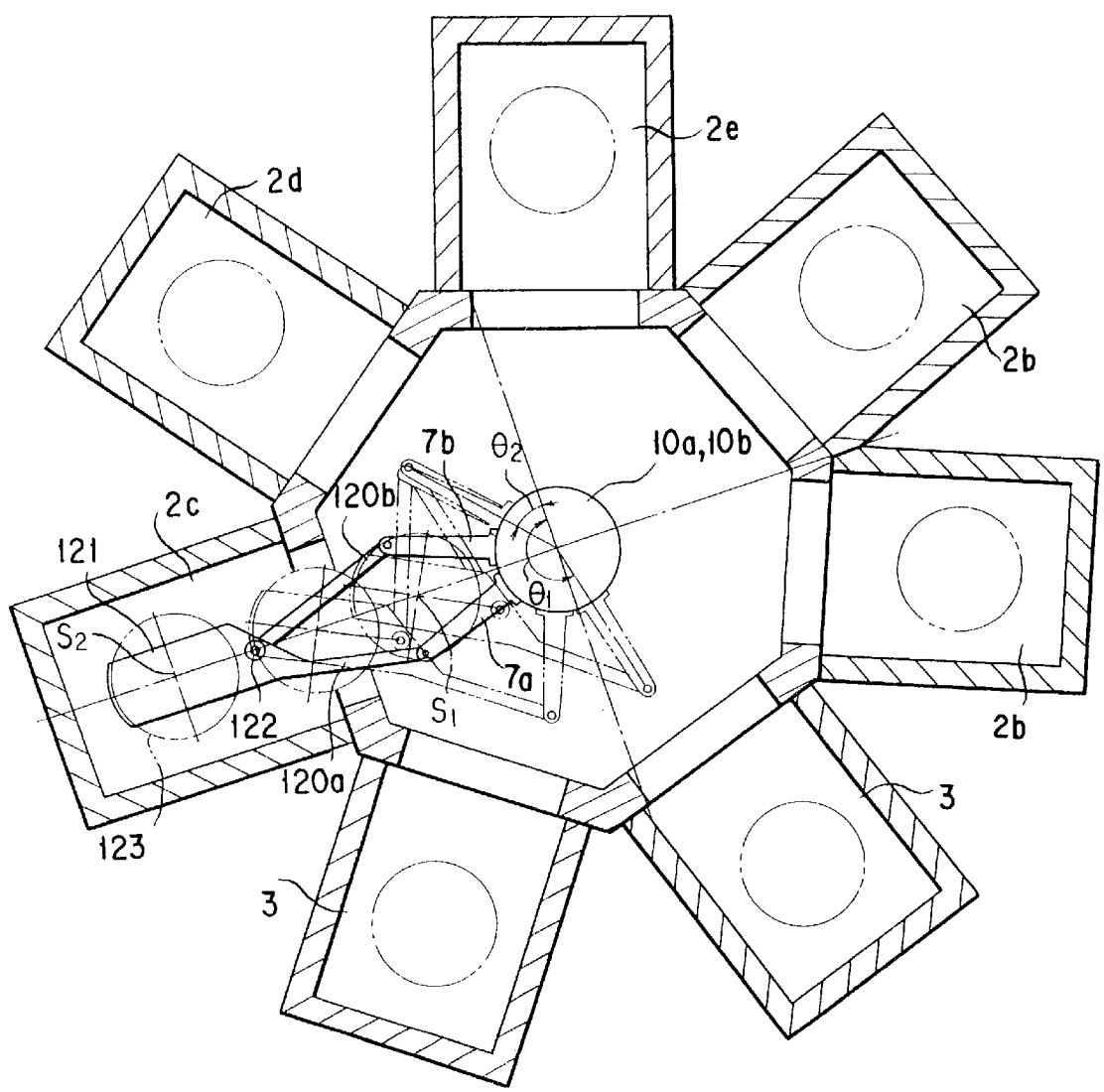
FIG. 30 is a top plan view showing another embodiment of the handling robot according to the present invention.

An explanation will now be given of another embodiment of the present invention with reference to FIGS. 30 and 31.

In the explanation of this embodiment as well, it should be noted that any component or part of the construction thereof which is identical to that in the construction of the prior art is denoted by the same reference numeral and character individually or in combination, and a detailed description thereof will be omitted.

The respective base ends of a first and a second link 120a and 120b are rotatably coupled to the respective leading ends of a first and a second arm 7a and 7b which project from a first and a second ring shaped boss 10a and 10b in a radial direction, respectively. The leading end of a first link 120a of the pair of links 120a and 120b is integrally constructed with a transfer table 121, whereas the leading end of the second link 120b is rotatably coupled at a rotary node 122 to the transfer table 121.

A structure for rotating the above mentioned ring shaped bosses 10a and 10b is identical to that shown in FIG. 5, so their respective angles of rotation may be controlled as desired by a motor unit.

In the construction mentioned above, it can be seen that by rotating the pair of ring shaped bosses 10a and 10b so that the pair of the arms 7a and 7b approach each other, the transfer table 121 will be pushed out by the action of the arms 7a and 7b and the links 120a and 120b. Consequently, the transfer table may be projected from the inside of the transfer chamber 1 via a gate 6 into a desired one of the stations.

If the pair of the ring shaped bosses 10a and 10b are rotated from this state in their respective directions in which the arms 7a and 7b depart from each other, the transfer table 120 will be sunk or retracted into the transfer chamber 1. This operation will then cause a wafer 123 that is mounted on the transfer table 121 to be delivered and conveyed over between the transfer chamber 1 and the station.

Then, since the transfer table 121 is made structurally integral with the first link 120a, the attitude of the transfer table 121 that is both projected and sunk or retracted will be identical to the attitude of the above mentioned link 120a. For this reason, the respective angles of rotation $\theta 1$ and $\theta 2$ of the arms 7a and 7b from their reference position for reciprocating the transfer table 121 between its most sunk or retracted position S1 and its most projected position S2. As shown in FIG. 30 are different from each other. More specifically, the motor unit is controlled so that the respective angle of rotation $\theta 1$ and $\theta 2$ of the pair of arms 7a and 7b from their reference position may be such angles of rotation that the transfer table 121 can be displaced so as to follow a trajectory extending from the most sunk or retracted position S1 in the transfer chamber 1 through the gate 6 to the most projected position that is a predetermined position in the station.

Then, a method of controlling the angles of rotation $\theta 1$ and $\theta 2$ of the above mentioned pair of arms 7a and 7b from a reference position will be explained based on the reference symbols shown in FIG. 31.

Figure 31:
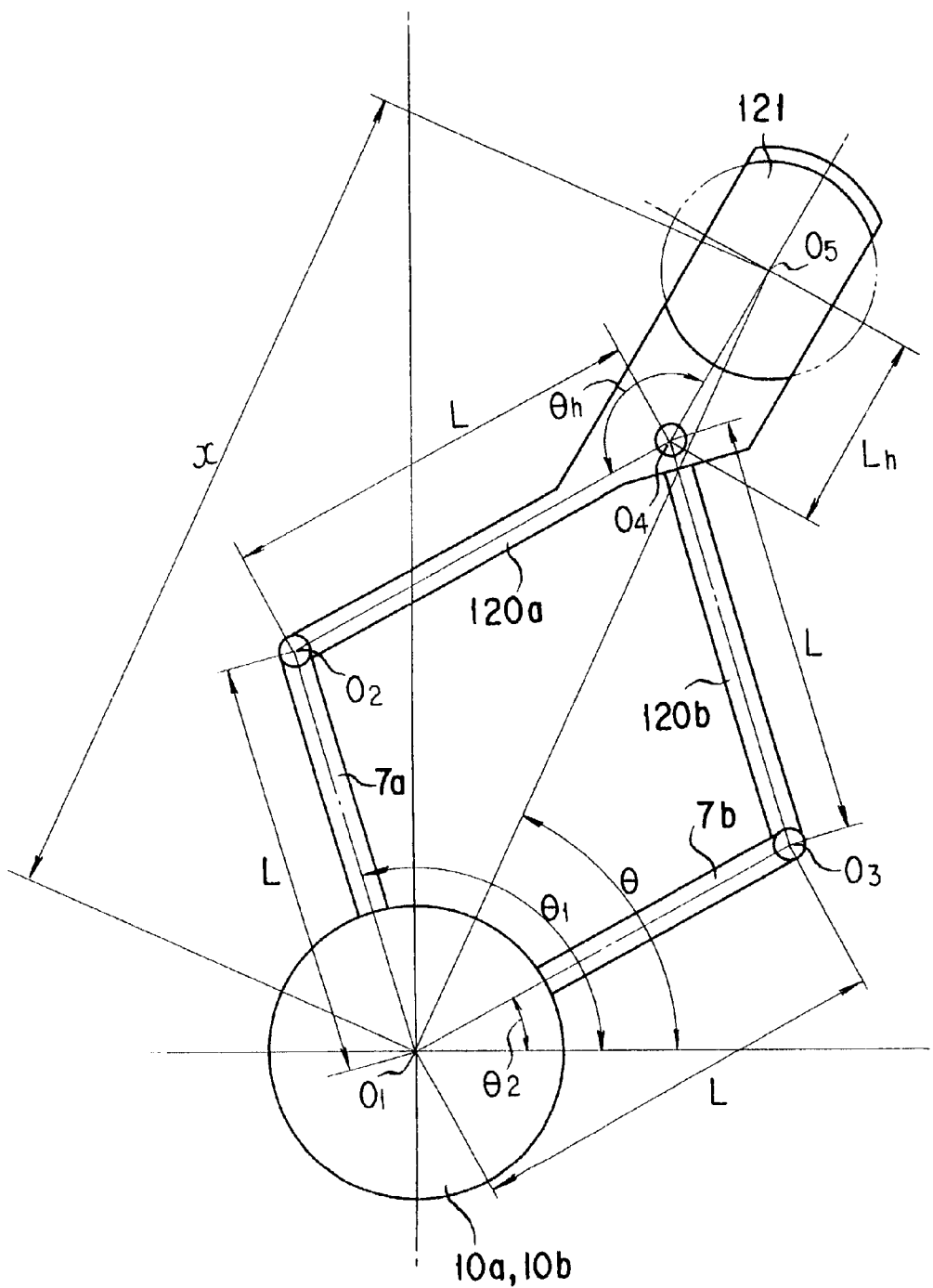
FIG. 31 is an explanatory view illustrating the sizes and the angles of rotation of an arm and a link with respect to a transfer table.

With reference to FIG. 31, it is assumed that: the turning center of the handling robot is represented by 01; the points at which the arms 7a and 7b and the links 120a and 120b are coupled together, respectively, are represented by 02 and 03, respectively; the point at which the second link 120b and the transfer table 121 are coupled together is represented by 04; the center of the transfer table 121 is represented by 05; the arms 7a and 7b and the links 120a and 120b have their respective lengths 01-02, 01-03, 02-04 and 03-04 which are identical to one another and represented by L; the distance between the point 04 at which the second link 120b and the transfer table 121 are coupled together and the center 05 of the transfer table 121 is represented by Lh; and the angle of attitude of the transfer table 121 with respect to the first link 120a that is integral therewith is represented by θh. It has been found that the angles of rotation θ1 and θ2 of the pair of arms 7a and 7b which are measured from the reference position and are required to displace the center 05 of the transfer table 121 from the turning center 01 of the handling robot over a distance x to a position that corresponds to an angle θ from the reference position are expressed by the following equations:

$$\theta_1 = \theta + \frac{\theta_\Delta}{2} - \arctan\left(\left(L_h\sin\theta_h + \frac{\theta_\Delta}{2}\right)\right) \bigg/ \left(2L\cos\frac{\theta_\Delta}{2} - L_h\cos\theta_h + \frac{\theta_\Delta}{2}\right)$$

$$\theta_2 = \theta - \frac{\theta_\Delta}{2} - \arctan\left(\left(L_h\sin\left(\theta_h + \frac{\theta_\Delta}{2}\right)\right)\right) \bigg/ \left(2L\cos\frac{\theta_\Delta}{2} - L_h\cos\theta_h + \frac{\theta_\Delta}{2}\right)$$

where $$\theta_\Delta = \theta_1 - \theta_2$$
$$= \arccos\Big(\big(-(L - L_h\cos\theta_h) \cdot$$
$$(-x^2 + 2L^2 + L_h^2 - 2LL_h\cos\theta_h) -$$
$$L_h\sin\theta_h\sqrt{4x^2L^2 - (2LL_h\cos\theta_h + x^2 - L_h^2)^2}\,\Big)\bigg/$$
$$(2L(L^2 - 2LL_h\cos\theta_h + L_h^2))\Big)$$

If the transfer table 121 is moved so as to project from the inside of the transfer chamber 1 over the distance x to a predetermined position within a selected station, it can thus be seen that the motor unit should be controlled so that respective angles of rotation θ1 and θ2 may meet the above identified equation.

If the pair of arms 7a and 7b are rotated in an identical direction in the state in which the transfer table 121 has been sunk or retracted, the transfer table 121 will be operatively turned in the transfer chamber 1 so as to oppose another of the stations.

Although in the above mentioned embodiment, the transfer table 121 is constructed so as to be structurally integral with the first link 120a, this is, of course, not a limitation. Thus, alternatively, the transfer table 121 and the first link 120a may be made separately and then be coupled together by a bolt or the like so as to be integral with each other.

Figure 4A:
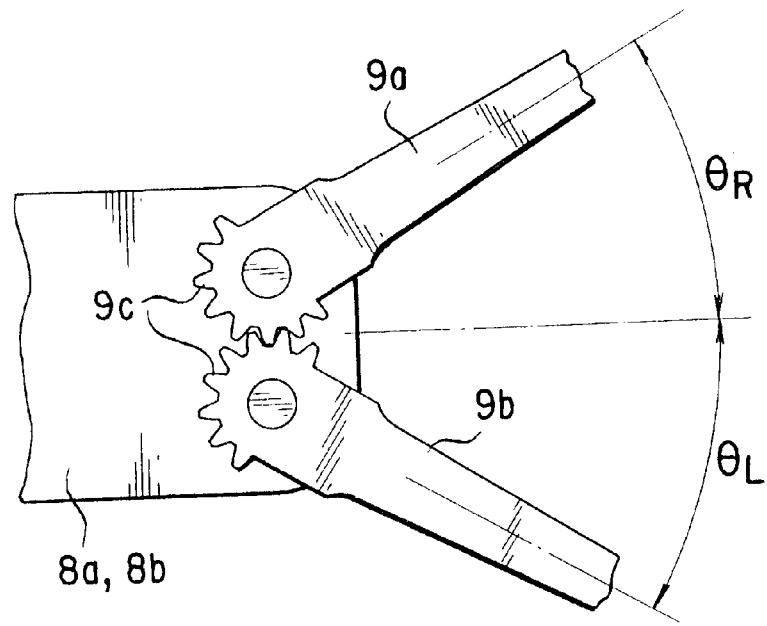
FIGS. 4A and 4B are explanatory views, each showing a transfer table attitude regulating mechanism.
Figure 4B:
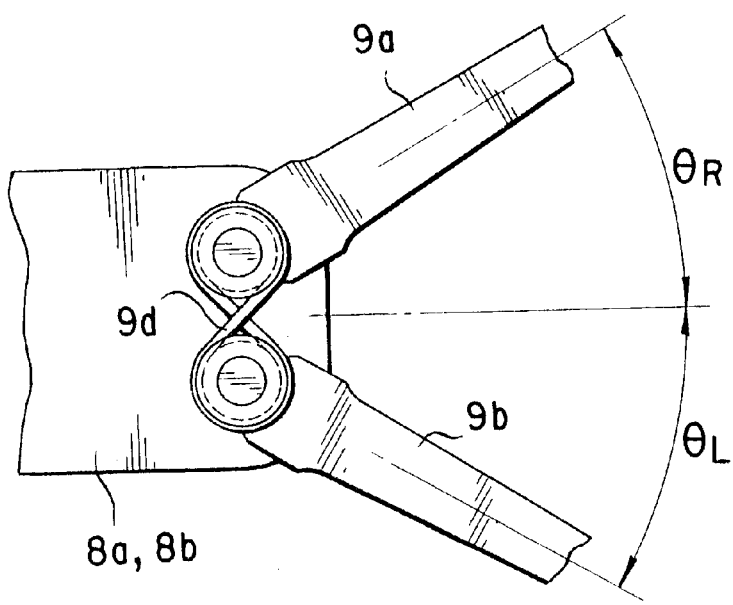
Figure 6:
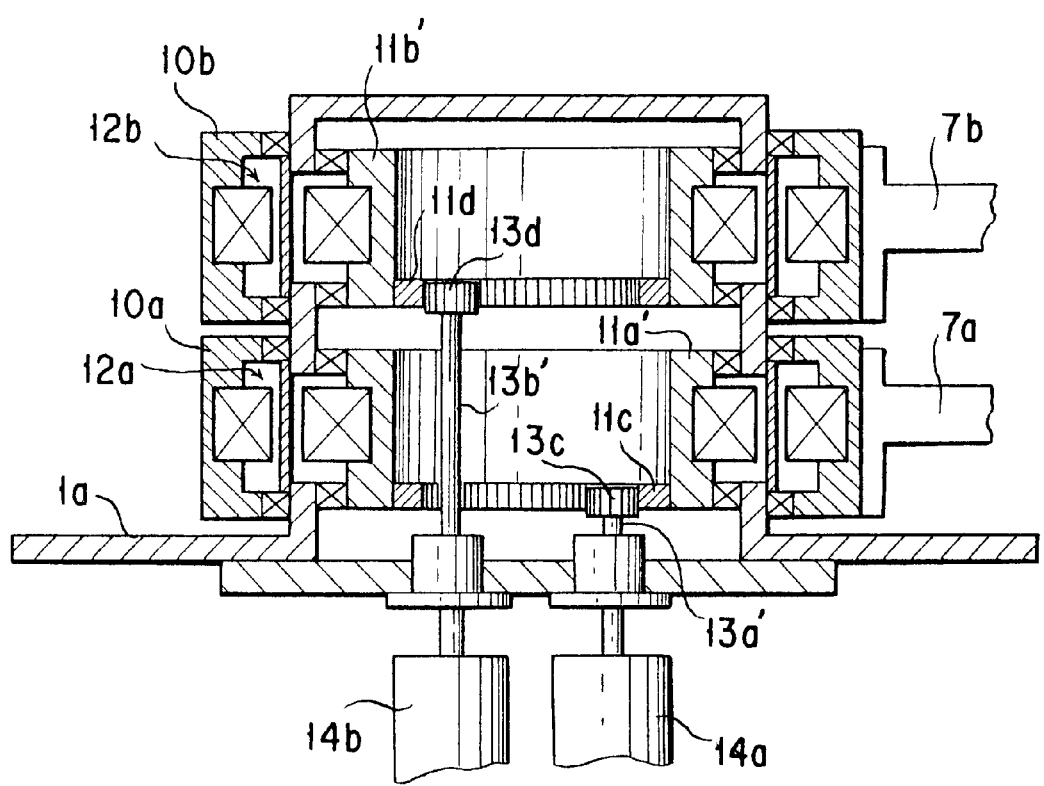
FIG. 6 is a cross sectional view illustrating another arm rotary mechanism for the conventional handling robot.
Figure 7A:
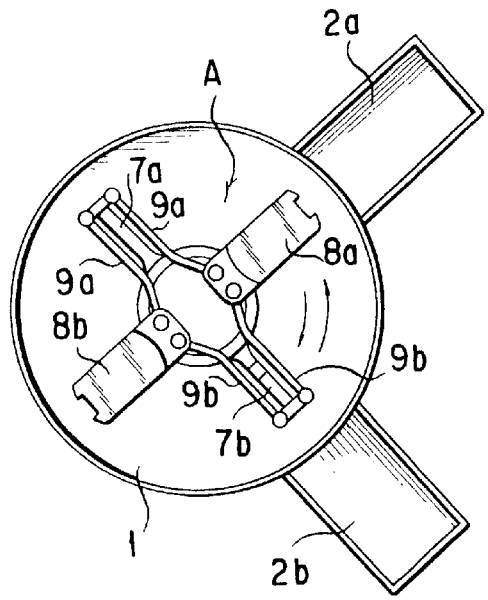
FIGS. 7A and 7B are each a functional explanatory view of the conventional handling robot.
Figure 7B:
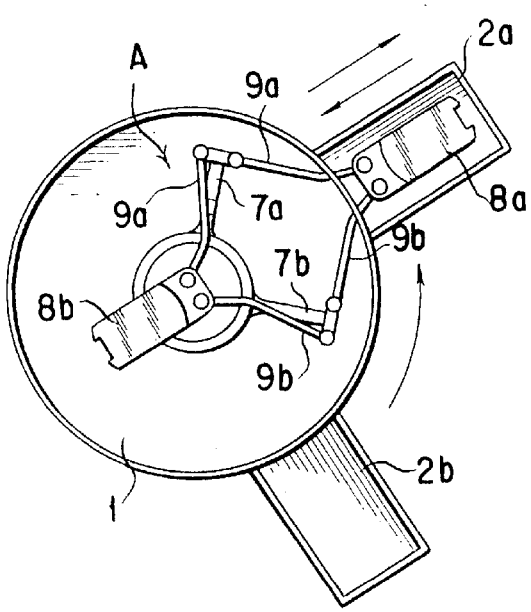

As set out in the foregoing description, it will be appreciated that by permitting the transfer table 121 and the pair of links 120a and 120b to be coupled together at a single rotary node 122, dust production can be significantly reduced in the present invention as compared with the prior art, in which the two rotary nodes have been required as in the transfer table attitude regulating mechanism B as shown in FIGS. 4A and 4B, and in which a gear or belt coupling has been essential. In addition, with the number of rotary nodes being reduced to only one, there is no loosening that adversely affects an operation of the handling robot according to the present invention. This loosening was has not otherwise avoidable with the two rotary nodes which have been essential in the prior art.

While the present invention has hereinbefore been described with respect to certain illustrative embodiments thereof, it will readily be appreciated by a person skilled in the art to be obvious that many alterations thereof, omissions therefrom and additions thereto can be made without departing from the essence and the scope of the present invention. Accordingly, it should be understood that the present invention is not limited to the specific embodiments thereof set out above, but includes all possible embodiments thereof that can be made within the scope with respect to the features specifically set forth in the appended claims and encompasses all equivalents thereof.

We claim:

1. A handling robot, comprising:
   two drive sources independent of each other;
   a first arm and a second arm rotated by said drive sources, respectively, wherein said first arm and said second arm are rotated about parallel axes and are rotated in parallel planes;
   a pair of links rotatably coupled to said first arm and said second arm, respectively, said pair of links including a first link and a second link; and
   a transfer table integrally formed on the end of said first link, said second link being coupled to said transfer table by a rotary node.

2. The handling robot of claim 1, wherein said transfer table is rotated by rotating said first arm and said second arm in an identical direction.

3. The handling robot of claim 1, wherein said transfer table is capable of being projected and retracted by rotating said first arm and second arm in opposite directions with respect to each other.

4. The handling robot of claim 1, wherein said axes are coaxial.

5. The handling robot of claim 1, wherein said first arm and said second arm are coupled to said drive sources, respectively, by magnetic couplings.

* * * * *